(12) United States Patent
Yamazaki

(10) Patent No.: US 7,535,053 B2
(45) Date of Patent: *May 19, 2009

(54) NONVOLATILE MEMORY AND ELECTRONIC APPARATUS

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/694,477

(22) Filed: Oct. 27, 2003

(65) Prior Publication Data

US 2004/0104424 A1 Jun. 3, 2004

Related U.S. Application Data

(63) Continuation of application No. 09/192,745, filed on Nov. 16, 1998, now Pat. No. 6,686,623.

(30) Foreign Application Priority Data

| Nov. 18, 1997 | (JP) | 9-333453 |
| Nov. 21, 1997 | (JP) | 9-337710 |
| Nov. 26, 1997 | (JP) | 9-340754 |

(51) Int. Cl.
*H01L 29/788* (2006.01)
(52) U.S. Cl. .................. 257/316; 257/345
(58) Field of Classification Search .......... 257/316, 257/345, 347, 349, 354
See application file for complete search history.

(56) References Cited

U.S. PATENT DOCUMENTS

| 3,890,632 | A | * | 6/1975 | Ham et al. ............... 257/354 |
| 4,004,159 | A | * | 1/1977 | Rai et al. ............... 365/185.28 |
| 4,454,524 | A | | 6/1984 | Spence |
| 4,495,693 | A | | 1/1985 | Iwahashi et al. .......... 29/571 |
| 4,549,336 | A | | 10/1985 | Sheppard |
| 4,697,198 | A | | 9/1987 | Komori et al. |
| 4,959,697 | A | | 9/1990 | Shier et al. |
| 4,999,682 | A | | 3/1991 | Xu et al. |
| 5,196,367 | A | | 3/1993 | Lu et al. |

(Continued)

FOREIGN PATENT DOCUMENTS

EP 0 369 676 A2 5/1990

(Continued)

OTHER PUBLICATIONS

Koyanagi et al, "Submicron Devices I," publisher: Maruzen Co., Ltd. (Japan), pp. 88-138, (1987).

(Continued)

*Primary Examiner*—Mark Prenty
(74) *Attorney, Agent, or Firm*—Cook Alex Ltd.

(57) ABSTRACT

An active region, a source region, and a drain region are formed on a single crystal semiconductor substrate or a single crystal semiconductor thin film. Impurity regions called pinning regions are formed in striped form in the active region so as to reach both of the source region and the drain region. Regions interposed between the pinning regions serve as channel forming regions. A tunnel oxide film, a floating gate, a control gate, etc. are formed on the above structure. The impurity regions prevent a depletion layer from expanding from the source region toward the drain region.

45 Claims, 17 Drawing Sheets

U.S. PATENT DOCUMENTS

| | | | |
|---|---|---|---|
| 5,198,879 A | 3/1993 | Ohshima | |
| 5,210,437 A | 5/1993 | Sawada et al. | 257/392 |
| 5,262,987 A | 11/1993 | Kojima | |
| 5,324,960 A | 6/1994 | Pfiester et al. | |
| 5,343,051 A | 8/1994 | Yamaguchi et al. | |
| 5,350,940 A | 9/1994 | Rona | |
| 5,405,802 A | 4/1995 | Yamagata et al. | 437/71 |
| 5,426,325 A | 6/1995 | Chang et al. | |
| 5,428,234 A | 6/1995 | Sumi | |
| 5,449,937 A | 9/1995 | Arimura et al. | |
| 5,455,791 A * | 10/1995 | Zaleski et al. | 365/185.26 |
| 5,488,001 A * | 1/1996 | Brotherton | 438/164 |
| 5,532,175 A | 7/1996 | Racanelli et al. | |
| 5,548,143 A | 8/1996 | Lee | 257/269 |
| 5,606,191 A | 2/1997 | Wang | |
| 5,608,231 A | 3/1997 | Ugojin et al. | |
| 5,614,752 A | 3/1997 | Takenaka | |
| 5,619,053 A | 4/1997 | Iwamatsu et al. | |
| 5,635,749 A | 6/1997 | Hong | |
| 5,643,826 A | 7/1997 | Ohtani et al. | 437/88 |
| 5,661,059 A | 8/1997 | Liu et al. | |
| 5,670,389 A | 9/1997 | Huang et al. | |
| 5,674,788 A | 10/1997 | Wristers et al. | |
| 5,675,164 A | 10/1997 | Brunner et al. | |
| 5,698,884 A | 12/1997 | Dennen | |
| 5,719,427 A | 2/1998 | Tong et al. | 257/355 |
| 5,786,618 A | 7/1998 | Wen | |
| 5,801,416 A | 9/1998 | Choi et al. | |
| 5,814,854 A | 9/1998 | Liu et al. | 257/315 |
| 5,818,083 A * | 10/1998 | Ito | 257/321 |
| 5,831,294 A | 11/1998 | Ugajin | |
| 5,885,872 A | 3/1999 | Tamaki et al. | |
| 5,893,740 A | 4/1999 | Chang et al. | |
| 5,894,137 A | 4/1999 | Yamazaki et al. | |
| 5,894,151 A | 4/1999 | Yamazaki et al. | |
| 5,905,291 A | 5/1999 | Utsunomiya et al. | |
| 5,929,479 A | 7/1999 | Oyama | 257/315 |
| 5,936,887 A * | 8/1999 | Choi et al. | 365/185.17 |
| 5,952,699 A | 9/1999 | Yamazaki et al. | 257/404 |
| 6,034,896 A | 3/2000 | Ranaweera et al. | 365/185.28 |
| 6,072,199 A | 6/2000 | Iwamuro | |
| 6,107,654 A | 8/2000 | Yamazaki et al. | |
| 6,111,296 A | 8/2000 | Yamazaki et al. | |
| 6,118,148 A | 9/2000 | Yamazaki et al. | |
| 6,127,702 A | 10/2000 | Yamazaki et al. | 257/347 |
| 6,184,556 B1 | 2/2001 | Yamazaki et al. | |
| 6,198,141 B1 | 3/2001 | Yamazaki et al. | 257/404 |
| 6,232,642 B1 | 5/2001 | Yamazaki | |
| 6,306,709 B1 | 10/2001 | Miyagi et al. | |
| 6,329,269 B1 | 12/2001 | Hamada et al. | |
| 6,498,376 B1 | 12/2002 | Miyagi et al. | |
| 6,653,687 B1 | 11/2003 | Yamazaki | |
| 6,686,623 B2 * | 2/2004 | Yamazaki | 257/315 |
| 2002/0102820 A1 | 8/2002 | Hamada et al. | |

FOREIGN PATENT DOCUMENTS

| | | | |
|---|---|---|---|
| JP | 61-256674 | 11/1986 | |
| JP | 62-11277 | 1/1987 | |
| JP | 62-71277 | 4/1987 | |
| JP | 63-300567 | 7/1988 | |
| JP | 3-54869 | 3/1991 | |
| JP | 4-79270 | 3/1992 | |
| JP | 4-96278 | 3/1992 | |
| JP | 5-82787 | 4/1993 | |
| JP | 5-136429 | 6/1993 | |
| JP | 5-341317 | 12/1993 | |
| JP | 6-60678 | 3/1994 | |
| JP | 7-86532 | 3/1995 | |
| JP | 07-130652 | 5/1995 | |
| JP | 8-64788 | 3/1996 | |
| JP | 08-078329 | 3/1996 | |
| JP | 8-274330 | 10/1996 | |
| JP | 08-293598 | 11/1996 | |
| JP | 8-330598 | 12/1996 | |
| JP | 09-055633 | 2/1997 | |
| JP | 9-107086 | 4/1997 | |
| JP | 09-165216 | 6/1997 | |
| JP | 09-212428 | 8/1997 | |
| JP | 10-065163 | 3/1998 | |
| JP | 10-65164 | 3/1998 | |
| JP | 10-093100 | 4/1998 | |
| JP | 11-17169 | 1/1999 | |
| WO | WO 88 03328 | 5/1992 | |
| WO | WO 97/02605 | * 1/1997 | 257/316 |

OTHER PUBLICATIONS

Okazawa et al, "Nikkei Microdevices," pp. 47-48, May 1992.

Ohuchi, K. et al, "A High-Performance 0.05μm SOI MOS FET: Possibility of Velocity Overshoot," Japanese Journal of Applied Physics, vol. 35, part 1, No. 2B, Feb. 1996, pp. 960-964.

* cited by examiner

Eg = Eg

SOURCE REGION
401
402
403

DRAIN REGION

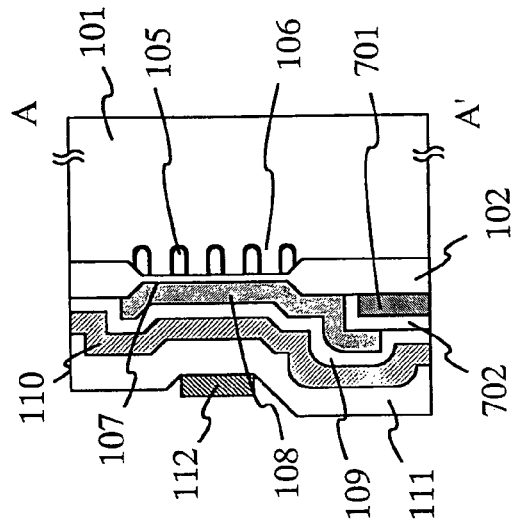
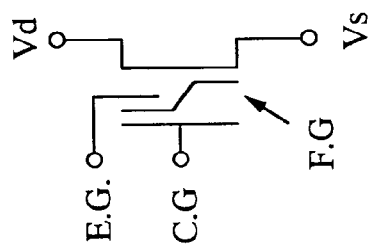
FIG. 7B
FIG. 7D
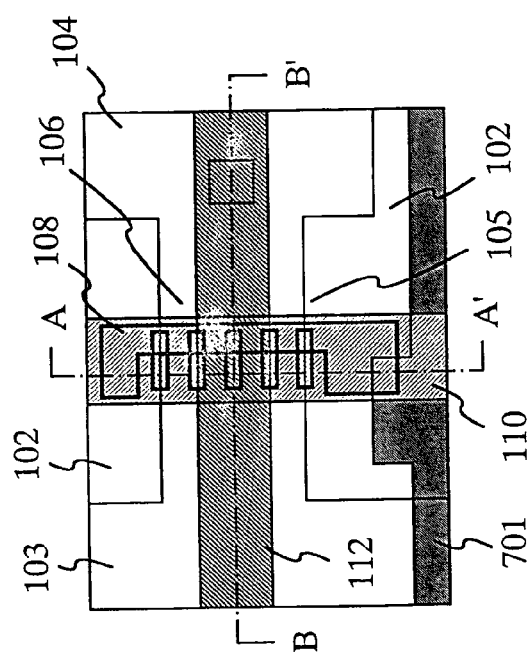
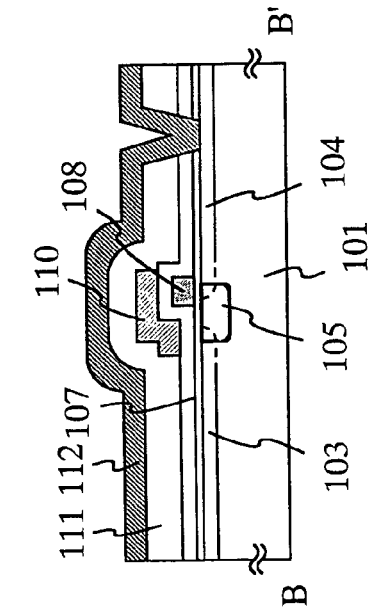
FIG. 7A
FIG. 7C

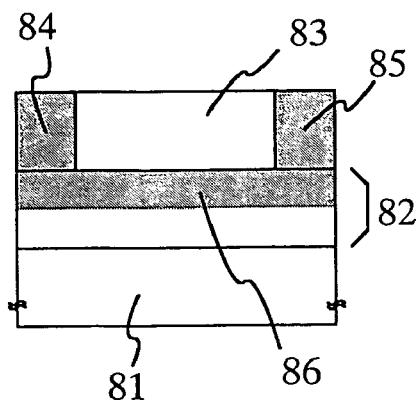
FIG. 17A
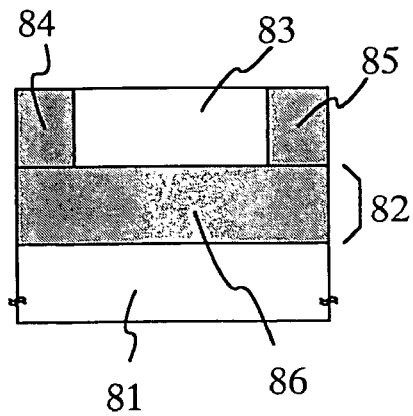
FIG. 17B
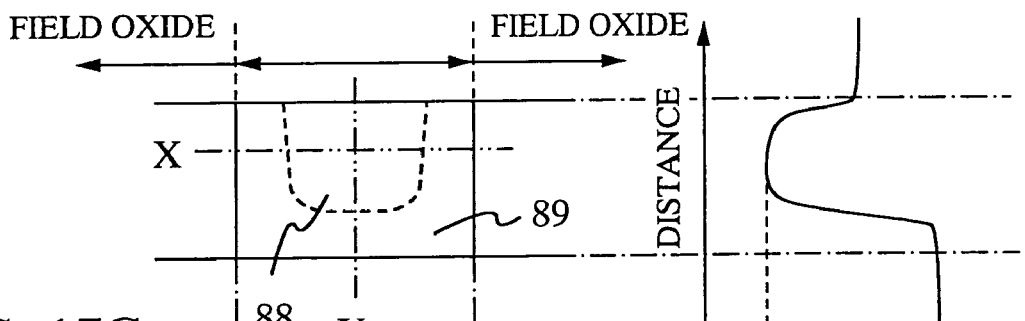
FIG. 17C
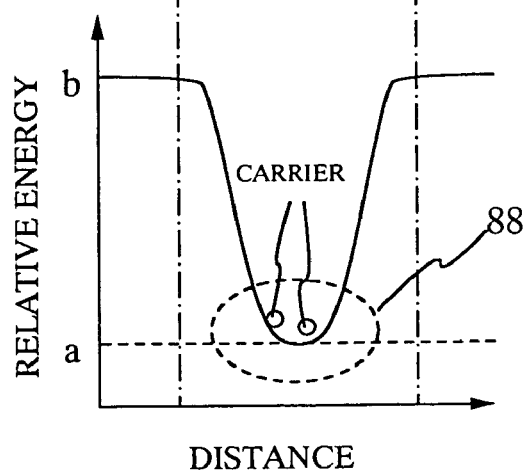
FIG. 17D
FIG. 17E

NONVOLATILE MEMORY AND ELECTRONIC APPARATUS

This application is a continuation of U.S. application Ser. No. 09/192,745, filed on Nov. 16, 1998 (now U.S. Pat. No. 6,686,623 issued Feb. 3, 2004).

BACKGROUND OF THE INVENTION

1. Field of the Invention

The present invention relates to the configuration of a nonvolatile memory formed by using a semiconductor. In particular, the invention for a nonvolatile memory in which the channel length is 2 μm or less or even 0.5 μm or less.

2. Description of the Related Art

The IC memories that perform data storage and holding in computers are generally classified into the RAM and the ROM. Examples of the RAM (random access memory) are the DRAM (dynamic RAM) and the SRAM (static RAM). If the power is turned off, data stored in the DRAM or the SRAM are lost.

On the other hand, examples of the ROM (read-only memory) are the mask ROM and the PROM (programmable ROM). The mask ROM and the PROM have an advantage that even if the power is turned off, data stored there are not lost. The PROM is classified into the EPROM (erasable PROM) in which data erasure is performed by using ultraviolet light, the EEPROM (electrically erasable PROM) in which data erasure is performed electrically, the flash memory (flash EEPROM) in which data erasure is performed en bloc electrically, and other types.

To fully utilize their marked advantage of permanent data holding, studies and developments on nonvolatile memories have been made energetically. At present, the possibility of using nonvolatile memories instead of magnetic memories is being discussed.

As for such IC memories, it is necessary to not only improve the reliability and performance but also increase the storage capacity. That is, as in the case of other types of ICs, such memory ICs are being developed according to the scaling law while miniaturization techniques are always adopted.

However, since basically nonvolatile memories store data according to the same principle of operation as field-effect transistors (hereinafter referred to as FETs), the short channel effect, which is known as causing serious problems in the FET operation, also causes serious problems in the operation of nonvolatile memories as the miniaturization advances.

In particular, the phenomenon called "punch-through" decreases the source-drain breakdown voltage and hence makes the current control with the gate electrode difficult. A SSW-DSA structure (Nikkei Microdevices, pp. 47-48, May issue, 1992) is a conventional example of increasing the punch-through resistance.

In the field of the FET, the SSW-DSA structure is a structure that utilizes a technique called a pocket structure in which an impurity region having the same conductivity type as the substrate is provided in the channel-drain junction portion. This structure can prevent the occurrence of a punch-through phenomenon by suppressing the expansion of the drain depletion layer.

However, in nonvolatile memories, electron-hole pairs are generated by positively causing impact ionization in the channel-drain junction portion. Therefore, a large amount of holes flow to the substrate side as electrons are injected into the floating gate.

However, in the SSW-DSA structure, a large amount of holes thus generated act in no other way than flow into the substrate terminal. This may cause a problem that a parasitic source-substrate-drain bipolar is formed to cause a kink phenomenon (an abnormal increase in drain current).

SUMMARY OF THE INVENTION

The present invention has been made in view of the above problems, and an object of the invention is therefore to realize a high-performance memory by effectively preventing or weakening the short channel effect that occurs in miniaturizing nonvolatile memories.

According to a first aspect of the invention, there is provided a nonvolatile memory comprising a source region, a drain region, and an active region that are formed by using a single crystal semiconductor; impurity regions provided locally in the active region; and an intrinsic or substantially intrinsic channel forming region interposed between the impurity regions.

According to a second aspect of the invention, there is provided a nonvolatile memory comprising a substrate having an insulating surface; a source region, a drain region, and an active region that are formed over the substrate by using a semiconductor thin film that is a single crystal or is substantially regarded as a single crystal; impurity regions provided locally in the active region; and an intrinsic or substantially intrinsic channel forming region interposed between the impurity regions.

According to a third aspect of the invention, there is provided a nonvolatile memory comprising a source region, a drain region, and an active region that are formed by using a single crystal semiconductor; impurity regions provided locally in the active region by adding an impurity element that is a group-13 or group-15 element; and an intrinsic or substantially intrinsic channel forming region interposed between the impurity regions.

According to a fourth aspect of the invention, there is provided a nonvolatile memory comprising a source region, a drain region, and an active region that are formed by using a single crystal semiconductor; impurity regions provided locally in the active region by adding an impurity element that is a group-13 or group-15 element, the impurity regions serving to prevent a depletion layer from expanding from the drain region toward the source region; and an intrinsic or substantially intrinsic channel forming region interposed between the impurity regions.

According to a fifth aspect of the invention, there is provided a nonvolatile memory comprising a substrate having an insulating surface; a source region, a drain region, and an active region that are formed over the substrate by using a semiconductor thin film that is a single crystal or is substantially regarded as a single crystal; impurity regions provided locally in the active region by adding an impurity element that is a group-13 or group-15 element; and an intrinsic or substantially intrinsic channel forming region interposed between the impurity regions.

According to a sixth aspect of the invention, there is provided a nonvolatile memory comprising a substrate having an insulating surface; a source region, a drain region, and an active region that are formed over the substrate by using a semiconductor thin film that is a single crystal or is substantially regarded as a single crystal; impurity regions provided locally in the active region by adding an impurity element that is a group-13 or group-15 element, the impurity regions serving to prevent a depletion layer from expanding from the drain region toward the source region; and an intrinsic or substantially intrinsic channel forming region interposed between the impurity regions.

In the above nonvolatile memories, it is preferable that the impurity regions be provided in striped form so as to reach both of the source region and the drain region.

In the above nonvolatile memories, it is preferable that an impurity element contained in the impurity regions have a concentration that is $1 \times 10^{17}$ to $5 \times 10^{20}$ atoms/cm$^3$.

In the above nonvolatile memories, it is preferable that the substrate be a crystallized glass substrate provided with an insulating film on a surface thereof.

It is effective to use any of the above nonvolatile memories as a recording medium.

The main feature of the invention is that impurity regions are formed locally in the active region and the impurity regions prevent a depletion layer from expanding from the drain region toward the source region. In this specification, a region that is enclosed by a source region, a drain region, and field oxide films is called an active region and the active region is divided into striped impurity regions and channel forming regions.

Since the effect of preventing expansion of a depletion layer looks like pinning the depletion layer, the inventors define the term "pinning" as meaning "prevention" (or "suppression").

BRIEF DESCRIPTION OF THE DRAWINGS

FIGS. 7A-7D show the structure of a nonvolatile memory according to a fourth embodiment of the invention;

FIGS. 17A-17E show an energy profile in a channel forming region and its vicinity according to a 13th embodiment of the present invention.

DETAILED DESCRIPTION OF THE PREFERRED EMBODIMENTS

Figure 1A:
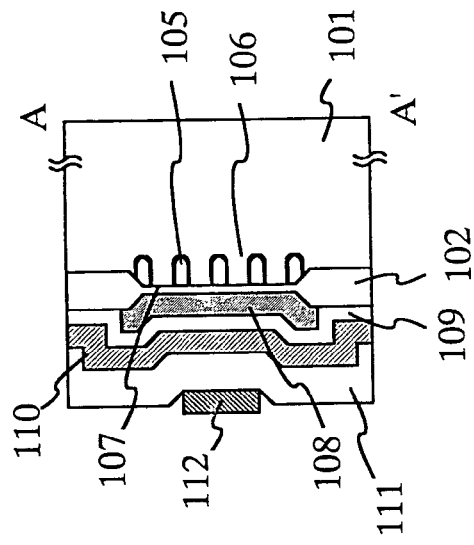
FIGS. 1A-1D show the structure of a nonvolatile memory according to a first embodiment of the present invention.

The present invention will be hereinafter described in detail by using embodiments.

Embodiment 1

This embodiment will be described with reference to FIGS. 1A-1D, which are a top view, sectional views, and a circuit representation of a non-volatile memory to which the invention is applied. This embodiment is directed to an EEPROM having a basic stacked structure.

In FIGS. 1A-1D, reference numeral 101 denotes a single crystal silicon (p-type silicon) substrate; 102, field oxide films formed by a LOCOS method; 103, a source region to which arsenic (or phosphorus) is added; and 104, a drain region. Although this is an example structure of an n-type EEPROM, it is also possible to construct a p-type EEPROM. A p-type EEPROM can be constructed by forming source and drain regions by adding boron to an n-type silicon substrate.

Reference numeral 105 denotes impurity regions (hereinafter referred to as pinning regions) that are the most important feature of the invention. The pinning regions 105 are formed by adding an impurity having the same conductivity type as the silicon substrate 101. In the example of FIGS. 1A-1D, since the p-type silicon substrate 101 is used, the pinning regions 105 are formed by adding an element selected from group-13 elements (typically boron). Naturally, where an n-type silicon substrate is used (a p-type EEPROM is to be manufactured), pinning regions may be formed by adding an element selected from group-15 elements.

The element selected from group-13 or group-15 elements shifts the energy band of single crystal silicon and thereby acts as an energy barrier to carriers (electrons or holes). In this sense, the pinning regions can also be called energy-banded-shifted regions. Elements other than the group-13 and group-15 elements can also be used as long as they have such an effect.

Figure 2A:
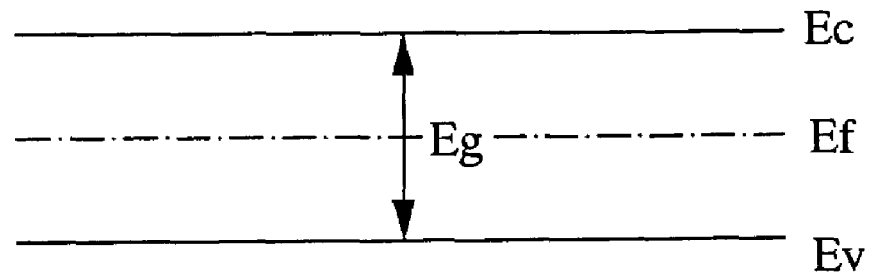
FIGS. 2A-2C illustrate changes of an energy band according to a first embodiment of the present invention.
Figure 2B:
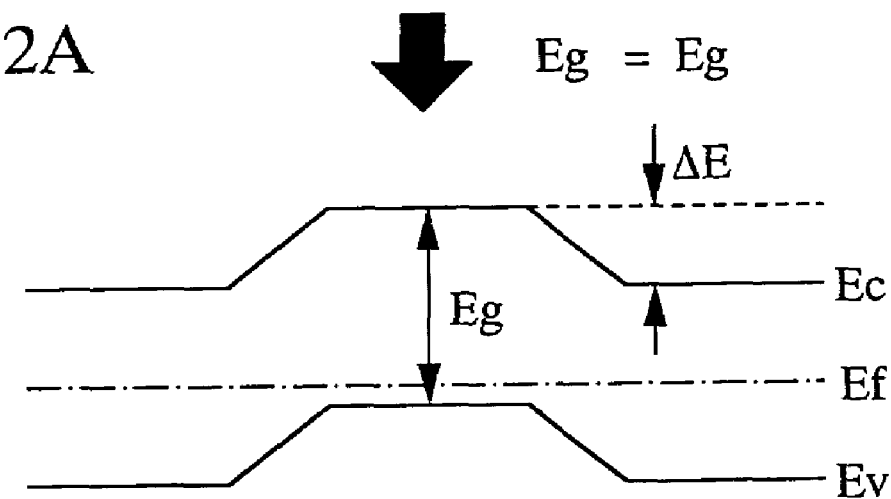

The effect of adding an energy-band-shifting element will be described below with reference to conceptual diagrams of FIGS. 2A-2C. FIG. 2A shows an energy band of single crystal silicon. If an impurity element (an element selected from group-13 elements) that shifts the energy band in such a direction as to obstruct the movement of electrons is added to single crystal silicon, the energy band is changed to a state as shown in FIG. 2B.

In the impurity-added region, although no change occurs in the energy band gap, the Fermi level (Ef) is moved to the valence band (Ev) side. As a result, the energy is shifted upward in appearance and hence an energy barrier having higher energy than the undoped regions by $\Delta E$ (for electrons) is formed.

Figure 2C:
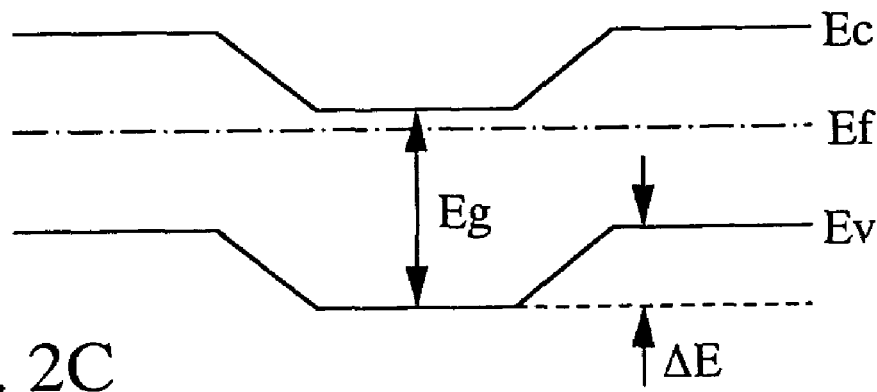

If an impurity element (an element selected from group-15 elements) that shifts the energy band in such a direction as to obstruct the movement of holes is added to single crystal silicon, the energy band is changed to a state as shown in FIG. 2C.

In the impurity-added region, the Fermi level is moved to the conduction band (Ec) side. As a result, the energy is shifted downward in appearance and hence an energy barrier having higher energy than the undoped regions by $\Delta E$ (for holes) is formed.

As described above, an energy difference of $\Delta E$ occurs between the undoped regions where the impurity is not added and the pinning regions 105. The height of the energy (i.e., potential) barrier depends on the concentration of the added impurity element. In the invention, the impurity element concentration is adjusted in a range of $1 \times 10^{17}$ to $5 \times 10^{20}$ atoms/cm$^3$ (preferably $1 \times 10^{18}$ to $5 \times 10^{19}$ atoms/cm$^3$).

Since the formation of the pinning regions 105 is enabled by microprocessing technology, it is necessary to use an impurity adding method suitable for microprocessing, such as ion implantation or an FIB (focused ion beam) method. Where an impurity adding method using a mask is employed, it is desirable to use microprocessing, for instance, forming a mask pattern by electron beam lithography.

Most typically, the pinning regions 105 are formed in such a manner that the pinning regions 105 are approximately parallel with channel forming regions 106 and the pinning regions 105 and the channel forming regions 106 are arranged alternately as shown in FIG. 1A. That is, it is preferable to form a plurality of striped pinning regions 105 in a region (active region) enclosed by the source region 103, the drain region 104, and the field oxide films 102.

It is effective to form pinning regions 105 at side end portions of the active region where the active region is in contact with to the field oxide films 102. The formation of pinning region 105 at the side end portions can reduce leak current that passes through the side end portions.

It is sufficient to form the pinning regions 105 so that they at least reach the junction portion of the active region and the drain region 104 (i.e., the drain junction portion). The intended effect can be obtained by preventing the expansion of the depletion layer at the drain junction portion because the depletion layer that causes the punch-through phenomenon develops from the drain junction portion. That is, the expansion of the depletion layer can be suppressed by forming dot-like or elliptical pinning regions 105 in the active region so that part of them exist in the drain junction portion.

Naturally, a more effective pinning effect can be obtained by forming the pinning regions 105 so that they reach both of the source region 103 and the drain region 104 as shown in FIG. 1A.

It is desirable that the implantation depth of the pinning regions 105 be greater than the junction depth of the source region 103 and the drain region 104. Therefore, it is necessary the implantation depth be 0.1-0.5 μm (preferably 0.2-0.3 μm).

Figure 3:
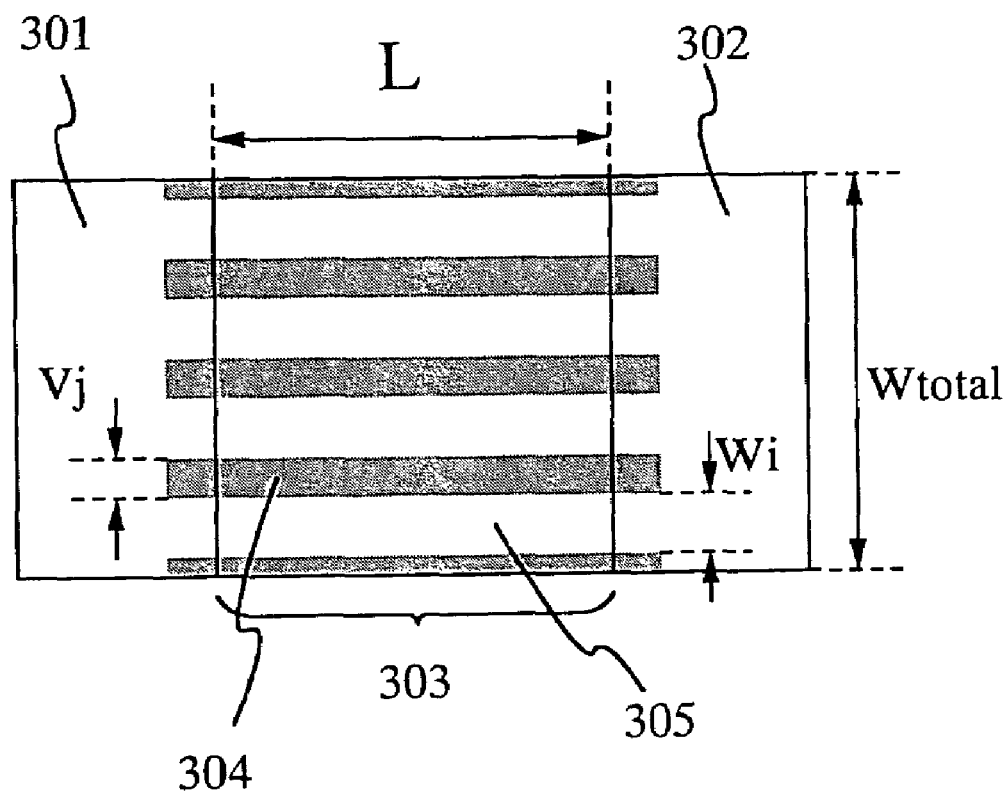
FIG. 3 illustrates definitions of a channel length and a channel width according to first and second embodiments of the present invention.

Now, the channel length and the channel width will be defined with reference to FIG. 3. In FIG. 3, the distance between a source region 301 and a drain region 302 (i.e., the length of an active region 303) is defined as a channel length L. The invention is effective in a case where the channel length L is 2 μm or less, typically 0.05-0.5 μm and preferably 0.1-0.3 μm. The direction along the channel length L is called a channel length direction.

The width of an arbitrary pinning region 304 is called a pinning width $v_j$. The pinning width $v_j$ may be set to 1 μm or less, typically 0.01-0.2 μm and preferably 0.05-0.1 μm. An effective pinning width V that is the sum of the widths of all pinning regions 304 existing in the active layer 303 is defined as $$V = \sum_{j=1}^{n} v_j$$

To obtain the pinning effect, it is necessary to form at least one pinning region 304 in the active region 303; that is, a condition n=1 or more needs to be satisfied. Where pinning regions 304 are formed at the side end portions (adjoining field oxide films) of the active region 303, a condition n=2 or more needs to be satisfied.

The width of a channel forming region 305 is called a channel width $w_i$. The channel width $w_i$ can be set to any value. For memories in which large current is not required, the channel width $w_i$ may be set to 1 μm or less, typically 0.05-0.5 μm and preferably 0.1-0.3 μm.

An effective channel width W that is the sum of all channel widths $w_i$ is defined as $$W = \sum_{i=1}^{m} w_i$$

Where the pinning regions 304 are formed only at the side end portions of the active region 303, m=1 is satisfied. A more effective pinning effect can be obtained by forming pinning regions 304 also in regions other than the side end portions of the active region 303. In such a case, m becomes 2 or more.

A total channel width $W_{total}$ that is the sum of the sum of the widths of all pinning regions 304 (i.e., the effective pinning width) and the sum of the widths of all channel forming regions 305 (i.e., the effective channel width) is defined as $$W_{total} = V + W$$

The total channel width $W_{total}$ corresponds to the width of the active region 303 (i.e., the length of the active region 303 in the direction perpendicular to the channel length direction). The direction along the total channel width $W_{total}$ is called a channel width direction.

Since the invention is intended to be applied to nonvolatile memories having an extremely short channel length as mentioned above, the pinning regions 304 and the channel forming regions 305 need to be formed so as to have extremely small dimensions.

Returning to FIGS. 1A-1D, it is preferable that the impurity element that has been added to the pinning region 105 be activated by furnace annealing, laser annealing, lamp annealing, or the like. The activation may be performed at the same time as annealing in a later step such as a step of forming a gate insulating film, or independently of such annealing.

The invention is characterized in that pinning regions are formed locally (i.e., in striped form) in a region of a conventional nonvolatile memory that serves as a channel forming region. Therefore, the other structures of the conventional nonvolatile memory can be employed as they are.

That is, a tunnel oxide film 107 is also formed on the single crystal silicon substrate 101 on which the source region 103, the drain region 104, and the pinning regions 105 are formed. The tunnel oxide film 107, which is formed by a thermal oxidation step, is required to have high film quality. In this embodiment, the thickness of the tunnel oxide film 107 is set to 11 nm. It goes without saying that the thickness of the tunnel oxide film 107 is not limited to this value.

In this embodiment, the pinning regions 105 may be formed even after the formation of the tunnel oxide film 107.

Figure 1C:
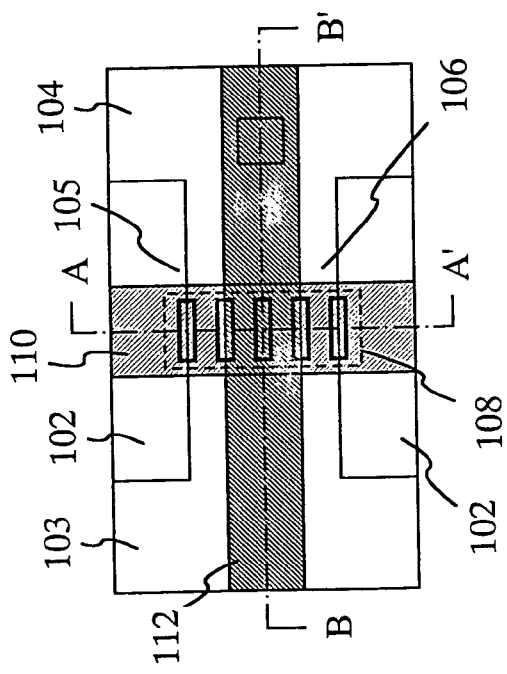
Figure 1B:
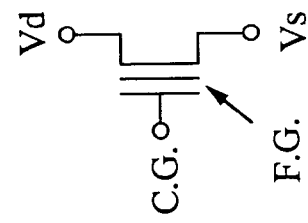

A first polysilicon layer as a floating gate 108 is formed on the tunnel oxide film 107. It is important to construct so that as shown in FIG. 1C the end portions of the floating gate 108 overlap the junction portions of the pinning portions 105 and the drain region 104.

A large amount of hot electrons are generated by concentrated electric fields at the above junction portions. Therefore, hot electrons can be injected at high efficiency by covering those junction portions with the floating gate 108.

After the formation of the floating gate 108, a first interlayer film 109, a second polysilicon layer as a control gate 110, a second interlayer film 111, and a bit line 112 are formed.

Naturally, a conductive layer such as a metal film can be used instead of the polysilicon layer. It is also effective to use, as the interlayer film, a laminated film as expressed by $SiO_2$/$SiN$/$SiO_2$ (commonly called an ONO film).

Figure 1D:
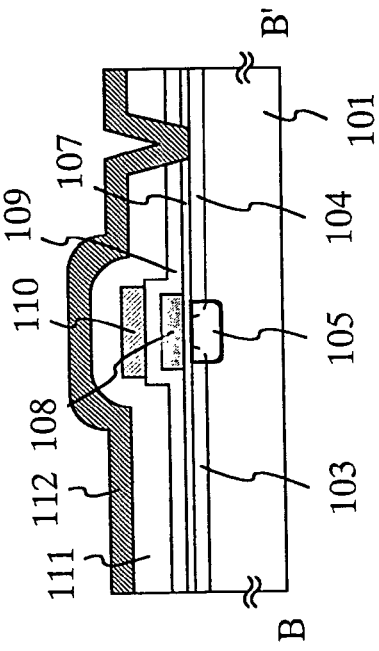

The two-layer polysilicon EEPROM of this embodiment is given a circuit representation shown in FIG. 1D, in which Vd denotes a drain voltage, Vs denotes a source voltage, C.G. denotes a control gate voltage, and F.G. denotes a potential of the floating gate 108.

In the EEPROM of this embodiment, the following voltages are applied at the time of data writing and erasure.

TABLE 1

| Mode | Vd | $V_{CG}$ | Vs | Mechanism |
| --- | --- | --- | --- | --- |
| Writing | 6 | 12 | 0 | Hot electron injection |
| Erasure | — | 0 | 12 | F-N tunneling erasure |
| Reading | ~1 | 5 | 0 | — |

Naturally, the operation voltages are not limited to the values of Table 1. Further, the invention is not limited to the structure of the first embodiment and can be applied to any kinds of EEPROMs in which data is erased electrically.

Functions and Advantages of the Invention

A first advantage of the invention will be described below. In FIGS. 1A-1D, the pinning regions 105 that are formed in the active region serve as stoppers with respect to the depletion layer that develops from the drain side and effectively suppress expansion of the depletion layer. Therefore, the punch-through phenomenon that is caused by expansion of the depletion layer can be prevented. Further, since an increase of depletion layer charge due to expansion of the depletion layer is suppressed, a reduction in threshold voltage can be prevented.

Next, a second advantage will be described. In the invention, the narrow channel effect can be enhanced intentionally by the pinning regions. The narrow channel effect, which is a phenomenon observed when the channel width is extremely narrow, causes an increase in threshold voltage (refer to Koyanagi et al., "Submicron Devices I," pp. 88-138, Maruzen Co., Ltd., 1987).

Figure 4:
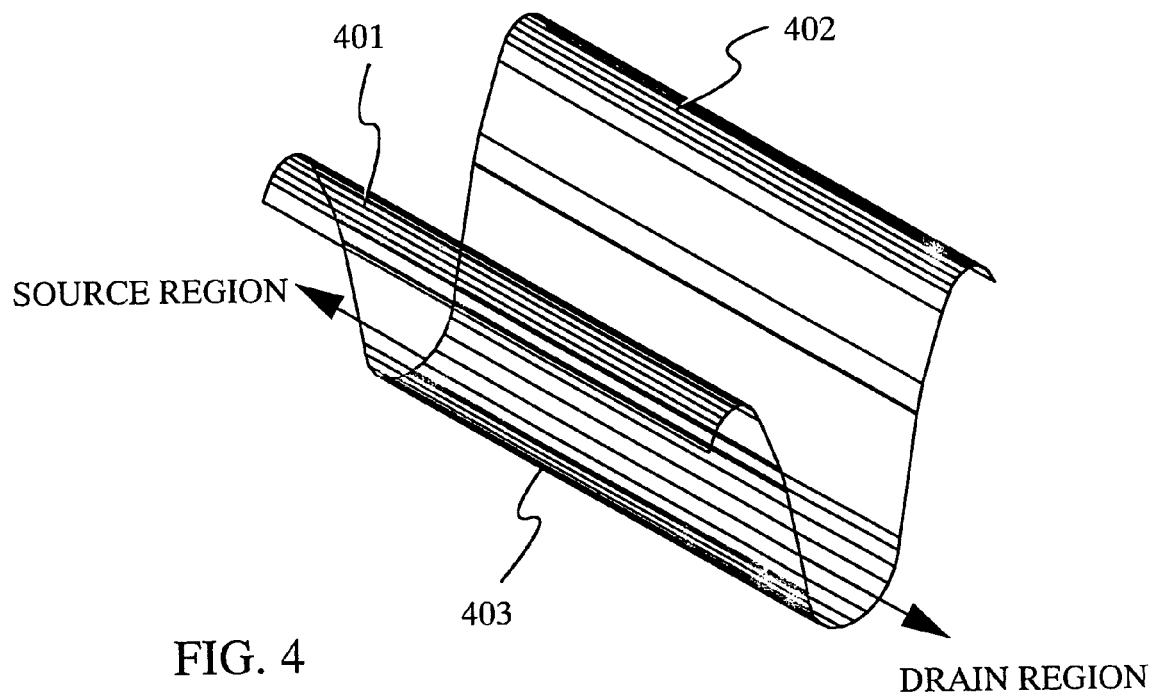
FIGS. 4 and 5 illustrate energy profiles in an active region according to a first embodiment of the present invention.

FIG. 4 shows an energy profile (potential profile) of the active region of the EEPROM of this embodiment operates. In FIG. 4, regions 401 and 402 represent the energy of pinning regions 105 and a region 403 represents the energy of a channel forming region 106.

As seen from FIG. 4, the pinning regions 105 form high-energy barriers and the channel forming regions 106 form low-energy regions. Therefore, carriers move through the channel forming regions 106 with priority where the energy is low.

In this manner, high-energy barriers are formed in the pinning regions 105 and the threshold voltage increases there. As a result, a threshold voltage that is observed as a value of the entire EEPROM also increases. This narrow channel effect becomes more remarkable as the effective channel width W decreases.

As described above, in the invention, since the concentration of an impurity that is added to the pinning regions 105 and the effective channel width W can be designed freely, the threshold voltage can be adjusted by controlling the degree of the narrow channel effect. That is, by properly controlling the pinning effect, the threshold voltage can be adjusted to a desired value by balancing a threshold voltage decrease due to the short channel effect with a threshold voltage increase due to the narrow channel effect.

Since a group-13 element is added to the pinning regions 105 in an n-type device and a group-15 element is added in a p-type device, the threshold voltage is shifted in the pinning regions 105 in a direction in which its absolute value increases (in the positive direction in an n-type device and in the negative direction in a p-type device). Since the threshold voltage increases locally, the threshold voltage of the entire device increases accordingly. Therefore, to adjust the threshold voltage to a desired value, it is important to set the concentration of an impurity that is added to the pinning regions 105 at a proper value.

Incidentally, in nonvolatile memories, discrimination between "0" and "1" is made by changing the threshold voltage by injecting charge (mainly electrons) into the floating gate and detecting whether current flows through the bit line when a certain voltage is applied. Therefore, if the threshold voltage is made unduly small by the short channel effect, it becomes necessary to discriminate between "0" and "1" by applying a very small voltage. In this case, the device becomes prone to be influenced by noise or the like and the possibility of occurrence of an erroneous operation increases.

In contrast, in the invention, since the threshold voltage can be controlled to have a desired value by decreasing a threshold voltage reduction, the ability of discriminating between "0" and "1" is increased. Therefore, the invention can realize a nonvolatile memory having very high reliability.

Next, a third advantage will be described. The nonvolatile memory according to the invention has an advantage that majority carriers (electrons in an n-type device and holes in a p-type device) move through the channel forming regions 106 that are substantially intrinsic regions.

The term "substantially intrinsic region" basically means an undoped single crystal semiconductor region, and includes a region where conductivity type compensation is made intentionally by adding an impurity element of the opposite conductivity type, and a region having one conductivity type in a range where the threshold voltage can be controlled.

For example, it can be said that a silicon wafer having a dopant concentration of $5 \times 10^{16}$ atoms/cm$^3$ or less (preferably $5 \times 10$ atoms/cm$^3$ or less) and carbon, nitrogen, and oxygen contents of $2 \times 10^{18}$ atoms/cm$^3$ or less (preferably $5 \times 10$ atoms/cm$^3$ or less) is substantially intrinsic. In this sense, silicon wafers commonly used are substantially intrinsic unless an impurity is added intentionally in a process.

Where a carrier movement region is substantially intrinsic, a mobility reduction due to the impurity scattering is extremely small and hence high carrier mobility is obtained. Therefore, the carrier movement is dominated by the influence of the lattice scattering and a state that is very close to the ideal state is obtained.

Where the straight pinning regions 105 are formed so as to reach both of the source region 103 and the drain region 104 as shown in FIG. 1A, an advantage is obtained that movement paths of majority carriers are defined by the pinning regions 105.

As described above, each channel forming region interposed between pinning regions has an energy profile as shown in FIG. 4. The structure of FIG. 1A is regarded as an arrangement of a plurality of slits each having the energy profile of FIG. 4.

Figure 5:
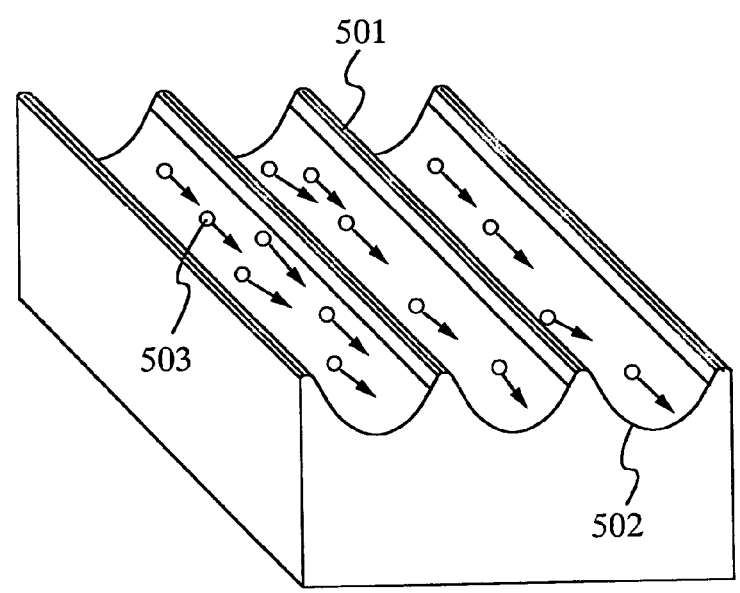

FIG. 5 schematically illustrates such a state. In FIG. 5, reference numerals 501 and 502 denote pinning regions and channel forming regions, respectively. As shown in FIG. 5, majority carriers (electrons or holes) 503 cannot go over the pinning regions 501 and hence move through the channel forming regions 502 with priority. That is, the movement paths of majority carriers 503 are defined by the pinning regions 501.

Defining the movement paths of majority carriers decreases the degree of scattering due to self-collision of carriers, which greatly contributes to mobility increase. Further, since only a very small amount of impurity elements exist in the substantially intrinsic channel forming regions, the velocity overshoot effect occurs, which is a phenomenon that the electron mobility becomes higher than usual even at room temperature (refer to K. Ohuchi et al., Jpn. J. Appl. Phys., Vol. 35, pp. 960, 1996). Therefore, the mobility becomes extremely high.

High carrier mobility that is obtained as described above is effective in shortening the charge write time and the charge read time, thereby increasing the memory performance. High carrier mobility means presence of carriers having high energy, and hence the charge writing efficiency is greatly increased by channel hot electron (CHE) injection.

Next, a fourth advantage of the invention will be described. Where the structure of the invention is employed, an electric field is concentrated to a large extent at the junction portions (typically, a $p^+/n^{++}$ junction or an n/p junction is formed) of the pinning regions and the drain region. Therefore, there occur a large amount of electrons that are given high energy through acceleration or generated by impact ionization (collectively called hot electrons).

Therefore, charge injection into the floating gate is performed very efficiently and hence the data write time can be shortened; specifically, it is reduced to $\frac{1}{10}$ to $\frac{1}{100}$ of that of conventional cases. By utilizing the invention, the data write time of a 256 Mbit stacked flash memory, which will be realized in the future, can be made 10 ns/byte or less, preferably 0.01-1 ns/byte.

Since this means realization of a data write operation faster than that of magnetic memories, it becomes possible to replace all kinds of current hard disks that are magnetic memories with flash memories. Since very small chips of flash memories will have functions equivalent to those of conventional magnetic memories, the miniaturization and the price reduction of devices will be accelerated. The invention is also effective in decreasing the voltage necessary for data writing (i.e., the write voltage). Specifically, by virtue of accelerated hot electron injection due to concentrated electric fields at the pinning regions/drain junction portions, charge of the same amount as in conventional cases can be injected by a write voltage that is $\frac{1}{2}$ to $\frac{1}{10}$ of conventional values.

Therefore, while current stacked flash memories requires a write voltage of about 10 V, the invention can realize a write voltage of 5 V or less, preferably about 1-3 V.

As described above, the hot electron inject efficiency at the drain junction portions can be increased by forming the pinning regions. This is effective in reducing the power consumption and increasing the degree of freedom in circuit designing.

Next, a fifth advantage will be described. The fact that the pinning regions of the invention have the functions of preventing the short channel effect and controlling the threshold voltage has been described above. In addition, the pinning regions of the invention have a very important role in preventing a parasitic bipolar from being rendered conductive due to impact ionization.

Conventionally, electrons of electron-hole pairs generated by impact ionization are injected into the floating gate. On the other hand, holes flow into the substrate and cause a substrate current, which renders a parasitic bipolar conductive.

In contrast, in the invention, holes generated by impact ionization immediately move into the pinning regions and extracted to the source region via the pinning regions. Therefore, the holes do not render a parasitic bipolar conductive and hence do not lower the source-drain breakdown voltage.

It goes without saying that this effect is particularly remarkable when the pinning regions are formed so as to reach both of the source and drain regions. Holes can be extracted more efficiently if the pinning regions are in contact with a pickup electrode in the source region.

Embodiment 2

This embodiment will be described with reference to FIGS. 6A-6D, which are a top view, sectional views, and a circuit representation of a non-volatile memory according to the invention that uses a single crystal silicon substrate having a buried oxide film. This embodiment is directed to an EEPROM having a basic stacked structure.

In FIGS. 6A-6D, reference numeral 600 denotes a single crystal silicon (p-type silicon) substrate; 601, a buried oxide film; 602, field oxide films formed by a LOCOS method; 603, a source region to which arsenic (or phosphorus) is added; and 604, a drain region.

Although this is an example structure of an n-type EEPROM, it is also possible to construct a p-type EEPROM. A p-type EEPROM can be constructed by forming source and drain regions by adding boron to an n-type silicon substrate.

The single crystal silicon substrate having a buried oxide film may be a SIMOX substrate, a UNIBOND substrate (a smart cut method is used), or the like. Naturally, other types of known SOI substrates may also be used.

It is preferable that the thickness of a single crystal silicon thin film formed on the buried oxide film 601 be set to 10-100 nm (typically 30-50 nm). As the thickness decreases, the hot electron injection occurs more easily and hence the write voltage can be made smaller.

Reference numeral 605 denotes impurity regions (pinning regions) that are the most important feature of the invention. The pinning regions 605 are formed by adding an impurity having the same conductivity type as the silicon substrate 601 (i.e., the conductivity type opposite to that of the source region 603 and the drain region 604).

In this embodiment, since the p-type silicon substrate 601 is used (the single crystal silicon thin film is also p-type), the pinning regions 605 are formed by adding an element selected from group-13 elements (typically boron). Naturally, where an n-type silicon substrate is used (a p-type EEPROM is to be manufactured), pinning regions may be formed by adding an element selected from group-15 elements (phosphorus, arsenic, or the like).

The element selected from group-13 or group-15 elements shifts the energy band of single crystal silicon and thereby acts as an energy barrier to carriers (electrons or holes). In this sense, the pinning regions can also be called energy-banded-shifted regions. Elements other than the group-13 and group-15 elements can also be used as long as they have such an effect. In the invention, the impurity element concentration is adjusted in a range of $1 \times 10^{17}$ to $5 \times 10^{20}$ atoms/cm$^3$ (preferably $1 \times 10^{18}$ to $5 \times 10^{19}$ atoms/cm$^3$).

Since the formation of the pinning regions 605 is enabled by microprocessing technology, it is necessary to use an impurity adding method suitable for microprocessing, such as ion implantation or a FIB (focused ion beam) method. Where an impurity adding method using a mask is employed, it is desirable to use microprocessing, for instance, forming a mask pattern by electron beam lithography.

Figure 6B:
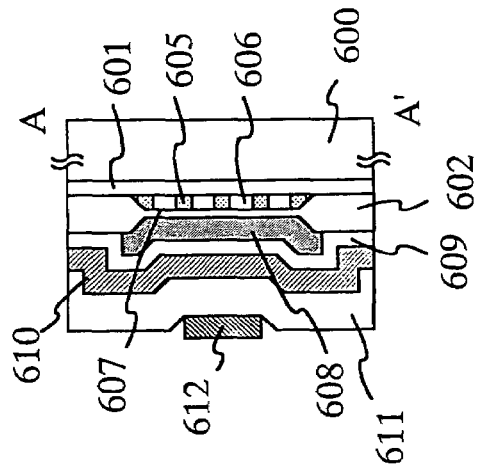
FIGS. 6A-6D show the structure of a nonvolatile memory according to a second embodiment of the invention.
Figure 6D:
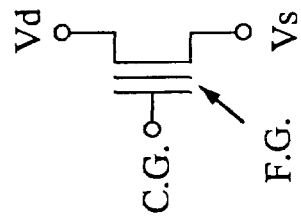
Figure 6A:
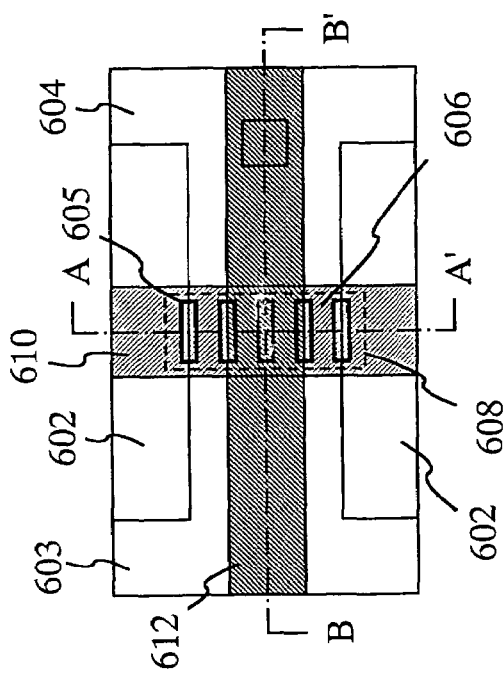

Most typically, the pinning regions 605 are formed in such a manner that the pinning regions 605 are approximately parallel with channel forming regions 606 and the pinning regions 605 and the channel forming regions 606 are arranged alternately as shown in FIG. 6A. That is, it is preferable to form a plurality of striped pinning regions 605 in a region (active region) enclosed by the source region 603, the drain region 604, and the field oxide films 602.

It is effective to form pinning regions 605 at side end portions of the active region where the active region joins to the field oxide films 602. The formation of pinning region 605 at the side end portions can reduce leak current that passes through the side end portions.

It is sufficient to form the pinning regions 605 so that they at least reach the junction portion of the active region and the drain region 604 (i.e., the drain junction portion). The intended effect can be obtained by preventing the expansion of the depletion layer at the drain junction portion because the depletion layer that causes the punch-through phenomenon develops from the drain junction portion. That is, the expansion of the depletion layer can be suppressed by forming dot-like or elliptical pinning regions 605 in the active region so that part of them exist in the drain junction portion.

Naturally, a more effective pinning effect can be obtained by forming the pinning regions 605 so that they reach both of the source region 603 and the drain region 604 as shown in FIG. 6A.

It is desirable that the implantation depth of the pinning regions 605 be such that the pinning regions 605 reach or go into the buried oxide film 601. In this embodiment, since the thickness of the single crystal silicon thin film is set to 10-100 nm (typically 30-50 nm), the implantation depth of the pinning regions 605 may be adjusted in a range of 10-150 nm (typically 30-100 nm).

Now, the channel length and the channel width will be defined with reference to FIG. 3. In FIG. 3, the distance between a source region 301 and a drain region 302 (i.e., the length of an active region 303) is defined as a channel length L. The invention is effective in a case where the channel length L is 2 µm or less, typically 0.05-0.5 µm and preferably 0.1-0.3 µm. The direction along the channel length L is called a channel length direction.

The width of an arbitrary pinning region 304 is called a pinning width $v_j$. The pinning width $v_j$ may be set to 1 µm or less, typically 0.01-0.2 µm and preferably 0.05-0.1 µm. An effective pinning width V that is the sum of the widths of all pinning regions 304 existing in the active layer 303 is defined as $$V = \sum_{j=1}^{n} v_j$$

To obtain the pinning effect, it is necessary to form at least one pinning region 304 in the active region 303; that is, a condition n=1 or more needs to be satisfied. Where pinning regions 304 are formed at the side end portions (adjoining field oxide films) of the active region 303, a condition n=2 or more needs to be satisfied.

The width of a channel forming region 305 is called a channel width $w_i$. The channel width $w_i$ can be set to any value. For memories in which large current is not required, the channel width $w_i$ may be set to 3 µm or less, typically 0.1-2 µm and preferably 0.1-0.5 µm.

An effective channel width W that is the sum of all channel widths $w_i$ is defined as $$W = \sum_{i=1}^{m} w_i$$

Where the width of the active region 303 is extremely small, for instance, 0.3 µm or less, the number of pinning regions 304 that can be formed in the active region 303 is limited. In such a case, the pinning regions 304 may be formed only at the side end portions of the active region 303.

In such a case, the number m of channel forming regions 305 is equal to 1. A more effective pinning effect can be obtained by forming pinning regions 304 also in regions other than the side end portions of the active region 303. In such a case, m becomes 2 or more.

A total channel width $W_{total}$ that is the sum of the sum of the widths of all pinning regions 304 (i.e., the effective pinning width) and the sum of the widths of all channel forming regions 305 (i.e., the effective channel width) is defined as $$W_{total} = V + W$$

The total channel width $W_{total}$ corresponds to the width of the active region 303 (i.e., the length of the active region 303 in the direction perpendicular to the channel length direction). The direction along the total channel width $W_{total}$ is called a channel width direction.

Since the invention is intended to be applied to nonvolatile memories having an extremely short channel length as mentioned above, the pinning regions 304 and the channel forming regions 305 need to be formed so as to have extremely small dimensions.

Returning to FIGS. 6A-6D, it is preferable that the impurity element that has been added to the pinning region 605 be activated by furnace annealing, laser annealing, lamp annealing, or the like. The activation may be performed at the same time as annealing in a later step such as a step of forming a gate insulating film, or independently of such annealing.

The invention is characterized in that pinning regions are formed locally (preferably in striped form) in a region of a conventional nonvolatile memory that serves as a channel forming region. Therefore, the other structures of the conventional nonvolatile memory can be employed as they are.

That is, a tunnel oxide film 607 is also formed on the single crystal silicon thin film on which the source region 603, the drain region 604, and the pinning regions 605 are formed. The tunnel oxide film 607 is formed by a thermal oxidation step because it is required to have high film quality. In this embodiment, the thickness of the tunnel oxide film 607 is set to 11 nm. It goes without saying that the thickness of the tunnel oxide film 607 is not limited to this value.

In this embodiment, the pinning regions 605 may be formed even after the formation of the tunnel oxide film 607.

Figure 6C:
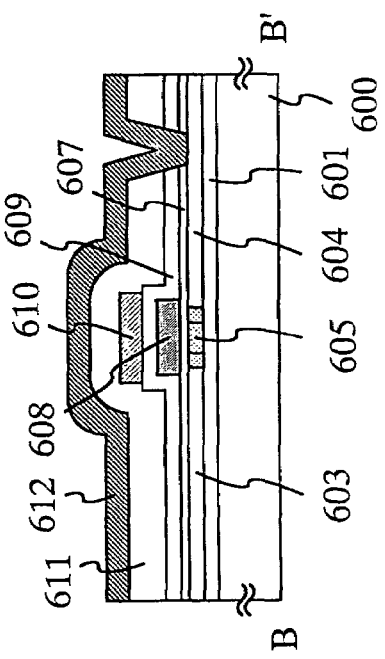

A first polysilicon layer as a floating gate 608 is formed on the tunnel oxide film 607. It is important to construct so that as shown in FIG. 6C the end portions of the floating gate 608 overlap the junction portions of the pinning portions 605 and the drain region 604.

A large amount of hot electrons are generated by concentrated electric fields at the above junction portions. Therefore, hot electrons can be injected at high efficiency by overlapping those junction portions with the floating gate 608.

After the formation of the floating gate 608, a first interlayer film 609, a second polysilicon layer as a control gate 610, a second interlayer film 611, and a bit line 612 are formed.

Naturally, a conductive layer such as a metal film can be used instead of the polysilicon layer. It is also effective to use, as the interlayer film, a laminated film as expressed by $SiO_2/SIN/SiO_2$ (commonly called an ONO film).

The two-layer polysilicon EEPROM of this embodiment is given a circuit representation shown in FIG. 6D, in which Vd denotes a drain voltage, Vs denotes a source voltage, C.G. denotes a control gate voltage, and F.G. denotes a potential of the floating gate 608.

In the EEPROM of this embodiment, the following voltages are applied at the time of data writing and erasure.

TABLE 1

| Mode | Vd | $v_{CG}$ | Vs | Mechanism |
|---|---|---|---|---|
| Writing | 6 | 12 | 0 | Hot electron injection |
| Erasure | — | 0 | 12 | F-N tunneling erasure |
| Reading | ~1 | 5 | 0 | — |

Naturally, the operation voltages are not limited to the values of Table 1. Further, the invention is not limited to the structure of this embodiment and can be applied to any kinds of EEPROMs in which data is erased electrically.

Embodiment 3

The two-layer polysilicon EEPROMs of the first and second embodiments are classified into a byte erasure type (data erasure is performed on a unit memory element basis) and a flash type (data of collective memory elements are erased en bloc).

The flash EEPROM is also called the flash memory. The invention can be applied to either of the two types of EEPROMs.

There are various data erasing methods such as a source erasure type, a source/gate erasure type, and a substrate erasure type. The invention can be applied to any of those methods.

Embodiment 4

While the first and third embodiments were directed to the two-layer polysilicon EEPROM using a single crystal semiconductor, this embodiment is directed to a case where the invention is applied to a three-layer polysilicon EEPROM. This embodiment will be described below with reference to FIGS. 7A-7D.

Since an EEPROM of this embodiment has the same basic structure as the two-layer polysilicon EEPROM described in the first embodiment, the reference numerals used in FIGS. 1A-1D are also used in this embodiment. That is, for the parts shown in FIGS. 7A-7D that are given the same reference numerals as in FIGS. 1A-1D, reference is made to the descriptions that were made above in connection with FIGS. 1A-1D. In this embodiment, only the parts that are different than in the first embodiment will be given new reference numerals and described below.

FIG. 7A is different from FIG. 1A in that an erasing gate 701 is newly provided. That is, a first polysilicon layer constitutes the erasing gate 701 and second and third polysilicon layers constitute the floating gate 108 and the control gate 110, respectively.

In the EEPROM that is configured according to the first embodiment, data erasure is performed by extracting, to the substrate side (the source region 103 or the bulk substrate 101), electrons that have been injected into the floating gate 108. In contrast, in the EEPROM that is configured according to this embodiment, data erasure is performed by extracting, to the erasing gate 701, electrons that have been injected into the floating gate 108.

Therefore, in FIG. 7B, an insulating film 702 for insulating the erasing gate 701 and the floating gate 108 from each other should be as thin as possible (preferably 8-12 nm) so as to allow a flow of tunnel current (Fowler-Nordheim current) as well as should be of such high quality as to be highly durable.

The EEPROM of this embodiment can be manufactured basically by the same process as that of the first embodiment with an exception that a step of forming the erasing gate 701 and the erasing gate insulating film 702 after formation of the pinning regions 105 is added.

An EEPROM having an erasing gate like the one of this embodiment is given a circuit representation shown in FIG. 7D, in which Vd denotes a drain voltage, Vs denotes a source voltage, E.G. denotes an erase gate voltage, C.G. denotes a control gate voltage, and F.G. denotes a floating gate potential.

In the EEPROM of this embodiment, the following voltages are applied at the time of data writing and erasure.

TABLE 2

| Mode | Vd | Vs | $V_{EG}$ | $V_{CG}$ | Mechanism |
|---|---|---|---|---|---|
| Writing | 8 | 0 | 3 | 12 | Hot electron injection into floating gate |
| Erasure | — | 0 | 20 | 0 | F-N tunneling erasure from floating gate |
| Reading | 1 | 0 | 0 | 5 | — |

Naturally, the operation voltages are not limited to the values of Table 2. Further, the invention is not limited to the structure of this embodiment and can be applied to any kinds of EEPROMs having an erasing gate structure.

Embodiment 5

While the second and third embodiments were directed to the two-layer polysilicon EEPROM using a single crystal silicon substrate having a buried oxide film, this embodiment is directed to a case where the invention is applied to a three-layer polysilicon EEPROM. This embodiment will be described below with reference to FIGS. 8A-8D.

Since an EEPROM of this embodiment has the same basic structure as the two-layer polysilicon EEPROM described in the second embodiment, the reference numerals used in FIGS. 6A-6D are also used in this embodiment. That is, for the parts shown in FIGS. 8A-8D that are given the same reference numerals as in FIGS. 6A-6D, reference is made to the descriptions that were made above in connection with FIGS. 6A-6D. In this embodiment, only the parts that are different than in the second embodiment will be given new reference numerals and described below.

Figure 8B:
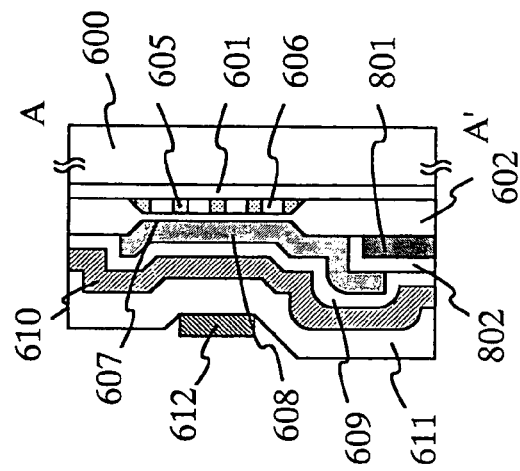
FIGS. 8A-8D show the structure of a nonvolatile memory according to a fifth embodiment of the invention.
Figure 8D:
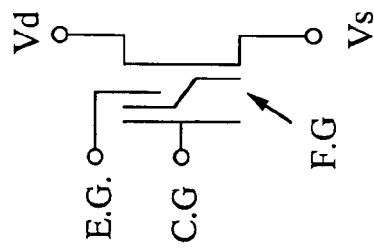
Figure 8A:
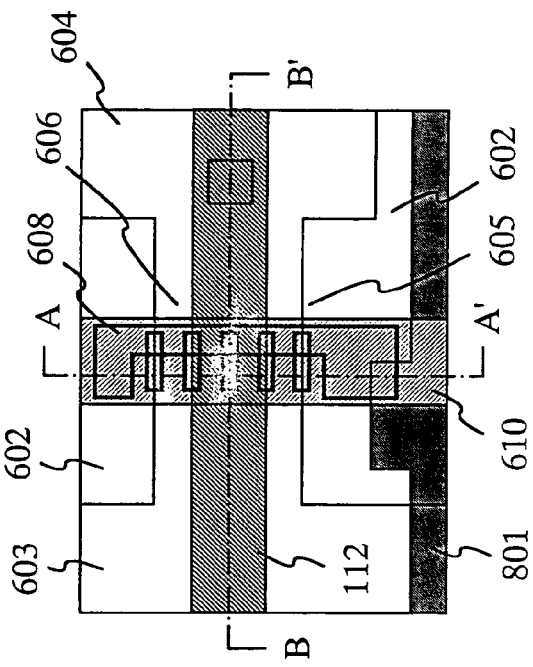
Figure 8C:
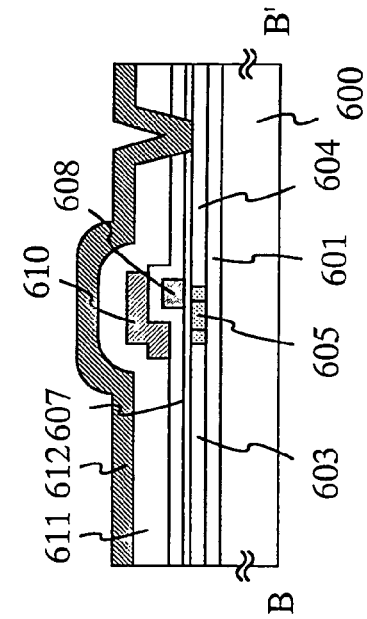

FIG. 8A is different from FIG. 6A in that an erasing gate 801 is newly provided. That is, a first polysilicon layer constitutes the erasing gate 801 and second and third polysilicon layers constitute the floating gate 608 and the control gate 610, respectively.

In the EEPROM that is configured according to the second embodiment, data erasure is performed by extracting, to the source region, electrons that have been injected into the floating gate 608. In contrast, in the EEPROM that is configured according to this embodiment, data erasure is performed by extracting, to the erasing gate 801, electrons that have been injected into the floating gate 608.

Therefore, in FIG. 8B, an insulating film 802 for insulating the erasing gate 801 and the floating gate 808 from each other should be as thin as possible (preferably 8-12 nm) so as to allow a flow of tunnel current (Fowler-Nordheim current) as well as should be of such high quality as to be highly durable.

The EEPROM of this embodiment can be manufactured basically by the same process as that of the second embodiment with an exception that a step of forming the erasing gate 801 and the erasing gate insulating film 802 after formation of the pinning regions 605 is added.

An EEPROM having an erasing gate like the one of this embodiment is given a circuit representation shown in FIG. 8D, in which Vd denotes a drain voltage, Vs denotes a source voltage, E.G. denotes an erase gate voltage, C.G. denotes a control gate voltage, and F.G. denotes a floating gate potential.

In the EEPROM of this embodiment, the following voltages are applied at the time of data writing and erasure.

TABLE 2

| Mode | Vd | Vs | $V_{EG}$ | $V_{CG}$ | Mechanism |
|---|---|---|---|---|---|
| Writing | 8 | 0 | 3 | 12 | Hot electron injection into floating gate |
| Erasure | — | 0 | 20 | 0 | F-N tunneling erasure from floating gate |
| Reading | 1 | 0 | 0 | 5 | — |

Naturally, the operation voltages are not limited to the values of Table 2. Further, the invention is not limited to the structure of this embodiment and can be applied to any kinds of EEPROMs having an erasing gate structure.

Embodiment 6

The nonvolatile memories according to the first to fifth embodiments utilize hot electron injection and Fowler-Nordheim current for data writing and erasure, respectively. This type of operation mode is called a stack mode.

The invention can also be applied to nonvolatile memories using Fowler-Nordheim current also for data writing. This type of operation mode is classified into a NAND type, an AND type, and a DINOR type.

In particular, in manufacturing a large-capacity memory of 256 Mbits or more, to improve the reliability (i.e., to elongate the life by decreasing the rate of deterioration) it is preferable to write data by using Fowler-Nordheim current.

Embodiment 7

The first embodiment was directed to the two-layer polysilicon EEPROM in which data erasure is performed electrically. On the other hand, the nonvolatile memory in which electrons that have been injected into the floating gate are extracted to the source or the substrate by exciting those by ultraviolet illumination or heating is called an EPROM. The invention can also be applied to the EPROM.

Among various kinds of EPROMs is a nonvolatile memory not using a floating gate in which a two-layer gate insulating film is provided between a control gate and a silicon substrate and hot electrons are captured by interface states of the two-layer gate insulating film. For example, a nonvolatile memory in which hot carriers are captured at the interface between a silicon oxide film and a silicon nitride film is called an NMOS nonvolatile memory.

Further, there are nonvolatile memories in which hot carriers are captured by metal clusters, silicon clusters, or the like that are formed intentionally at an interface between insulating films.

The invention can be applied to all kinds of EPROMs as exemplified above.

Embodiment 8

Since the invention is applicable to all kinds of conventional nonvolatile memories, it can be applied to all the known circuit configurations. This embodiment is directed to a case where the invention is applied to flash memories that are designed according to the NAND and NOR type architectures, respectively.

First, a description will be made of the configuration of a NAND-type memory circuit shown in FIGS. 9A and 9B, which is composed of eight memory transistors and two selection transistors.

Figure 9A:
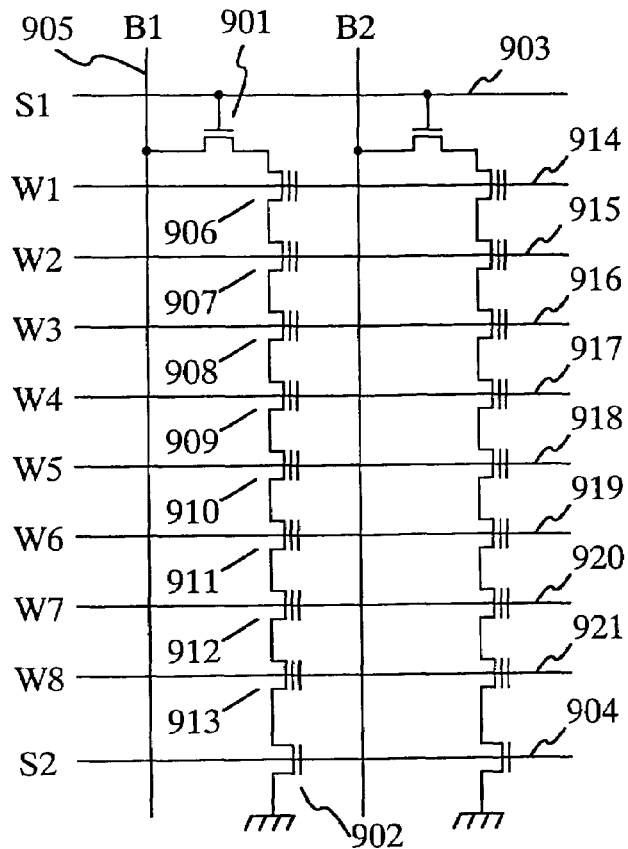
FIGS. 9A and 9B show a circuit using nonvolatile memory cells according to an eighth embodiment of the invention.

As shown in FIG. 9A, selection transistors 901 and 902 have selection lines S1 and S2 (903 and 904) as gate electrodes, respectively. The selection transistor 901 connects a bit line B1 (or B2; 905) to eight memory transistors 906-913.

Although this embodiment is directed to a case where eight memory transistors are connected to each other in series, the number of memory transistors is not limited to 8.

The selection transistor 902 is connected to a final-stage memory transistor 913. The other terminal of the selection transistor 902 is grounded. Even if it is connected to a power supply line, the memory circuit still operates properly.

The memory transistors 906-913 use word lines W1-W8 (914-921) as control gates, respectively.

Figure 9B:
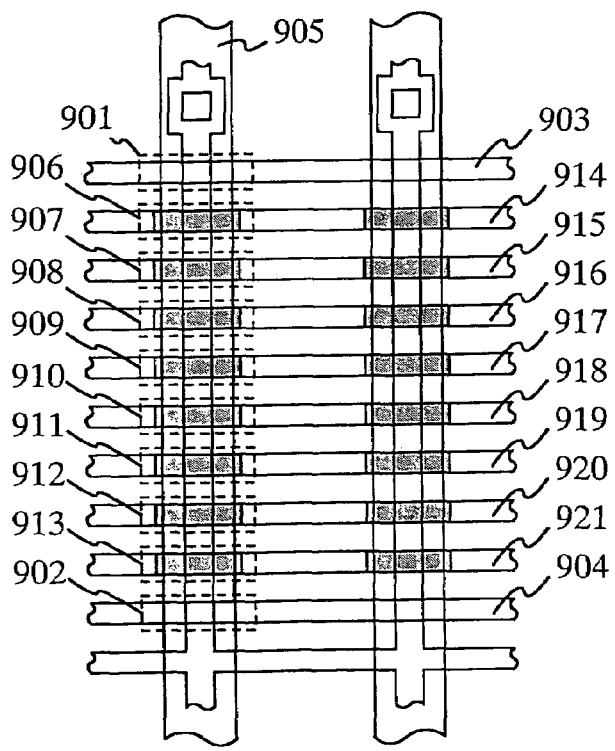

FIG. 9B is a schematic circuit pattern of the NAND-type memory circuit of FIG. 9A. In the memory transistors 906-913, hatched regions are floating gates that are provided under the respective control gates 914-921.

Next, a description will be made of the configuration of a NOR-type memory circuit shown in FIGS. 10A and 10B, which is composed of four memory transistors.

Figure 10A:
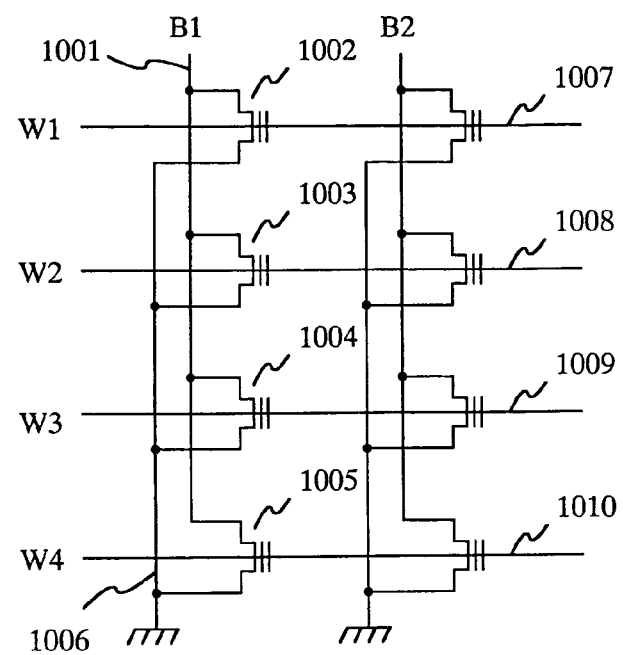
FIGS. 10A and 10B show another circuit using nonvolatile memory cells according to the eighth embodiment of the invention.

As shown in FIG. 10A, four memory transistors 1002-1005 are individually connected to a bit line B1 (1001). Those terminals (source regions) of the respective memory transistors 1002-1005 which are not connected to the bit line 1001 are connected to a ground line 1006.

The memory transistors 1002-1005 use word lines W1-W4 (1007-1010) as control gates, respectively.

Figure 10B:
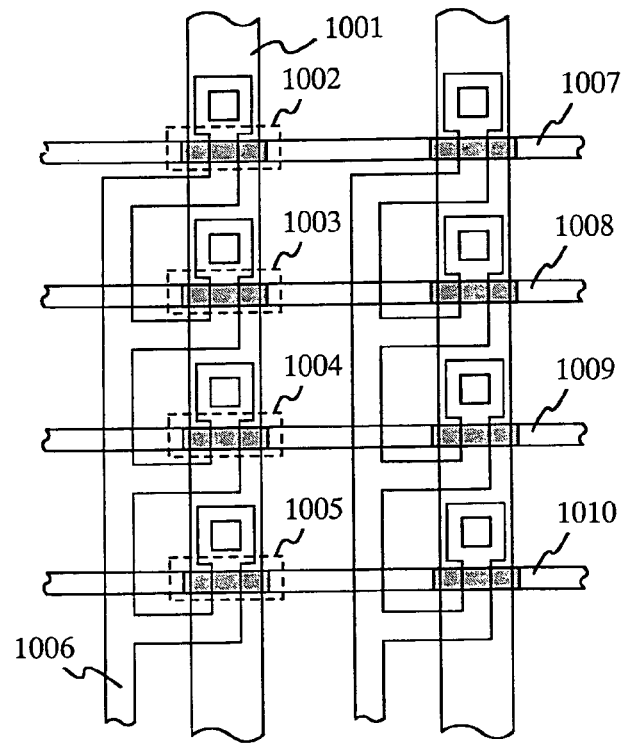

FIG. 10B is a schematic circuit pattern of the NOR-type memory circuit of FIG. 10A. In the memory transistors 1002-1005, hatched regions are floating gates that are provided under the control gates 1007-1010, respectively.

Although NAND-type circuits as shown in FIGS. 9A and 9B have disadvantages that the order of writing is fixed and the read access time is long, they have an advantage that the integration density can greatly be increased.

The configuration of the NOR-type circuit shown in FIGS. 10A and 10B is effective in injecting electrons precisely into the floating gates and reading out charge amounts precisely. This is the feature of the NOR architecture in which individual memory transistors are directly connected to a source-drain bus line.

Although this embodiment is directed to the circuits that use nonvolatile memory cells having a two-layer electrode structure (polysilicon or the like), the same circuits can be configured by using nonvolatile memory cells having the three-layer electrode structure (including the erasing gate) as described above in the fourth or fifth embodiment.

Embodiment 9

This embodiment is directed to a case where a nonvolatile memory according to the invention is applied to a microprocessor that is integrated on one chip, such as a RISC processor or an ASIC processor.

Figure 11:
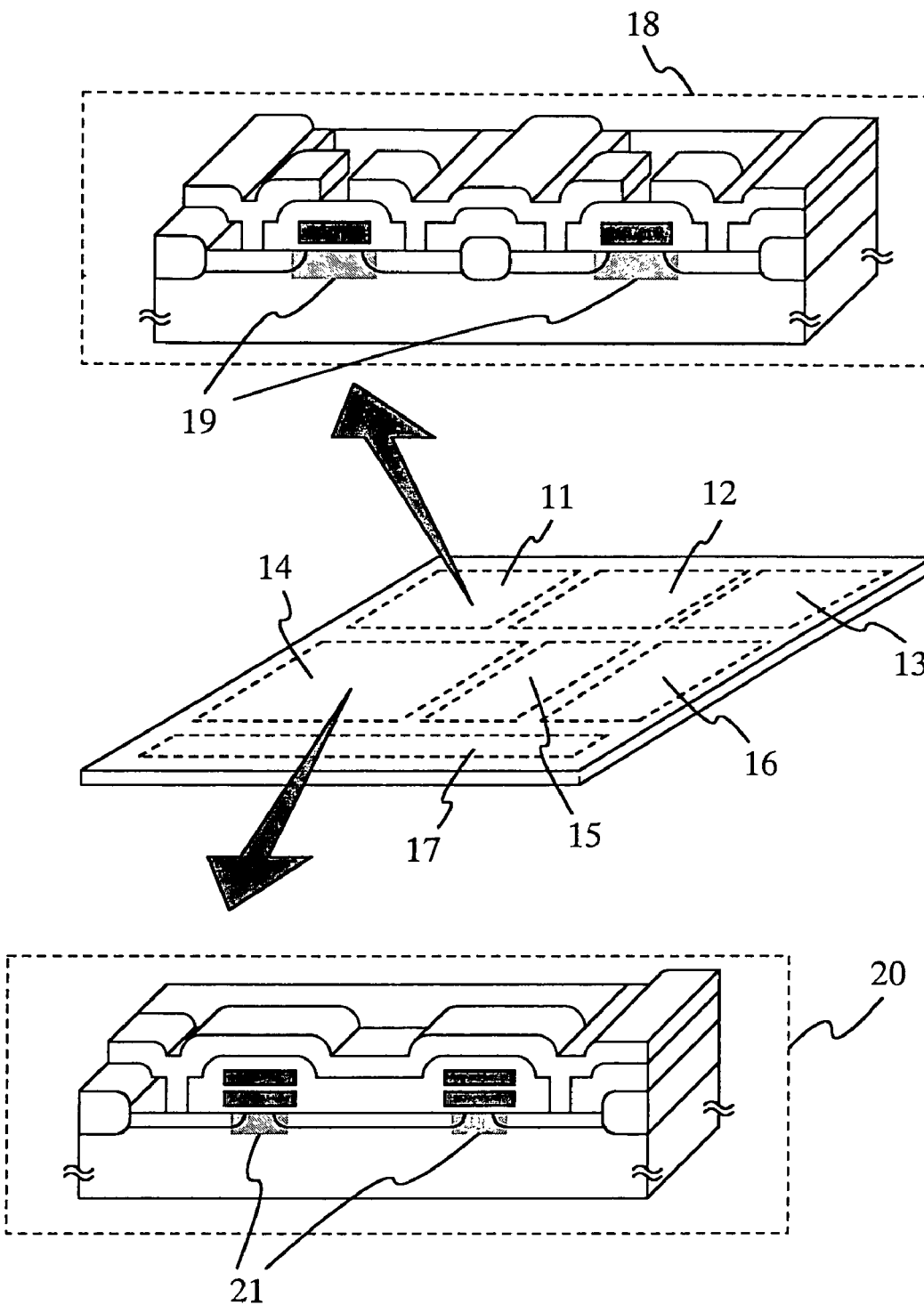
FIGS. 11 and 12 show microprocessors according to a ninth embodiment of the invention to which a nonvolatile memory of the invention is applied.

FIG. 11 shows an example of a microprocessor, which is typically composed of a CPU core 11, a flash memory 14 (or a RAM), a clock controller 13, a cache memory 12, a cache controller 15, a serial interface 16, an I/O port 17, and other components.

The microprocessor of FIG. 11 is a simplified example. Naturally, a variety of circuit designs are employed in actual microprocessors in accordance with their uses.

In the microprocessor of FIG. 11, the CPU core 11, the clock controller 13, the cache controller 15, the serial interface 16, and the I/O port 17 are constituted of CMOS circuits 18. Pinning regions 19 according to the invention are formed in the CMOS circuits 18.

In this manner, the basic concept of the invention can be applied to MOSFETs as well as nonvolatile memories, as disclosed in detail in Japanese Patent Laid-Open No. Hei. 10-65163. Japanese Patent Laid-Open No. Hei. 10-65163 has a corresponding U.S. patent application Ser. No. 08/912,979, which is herein incorporated by reference.

The flash memory 14 uses nonvolatile memory cells according to the invention that form a memory circuit 20. Every memory cell that constitutes the memory circuit 20 is formed with pinning regions 21. It is possible to use nonvolatile memory cells according to the invention also in the cache memory 12.

As described above, in the example of FIG. 11, the pinning technology of the invention is utilized in all of the memory sections and the logic sections.

Figure 12:
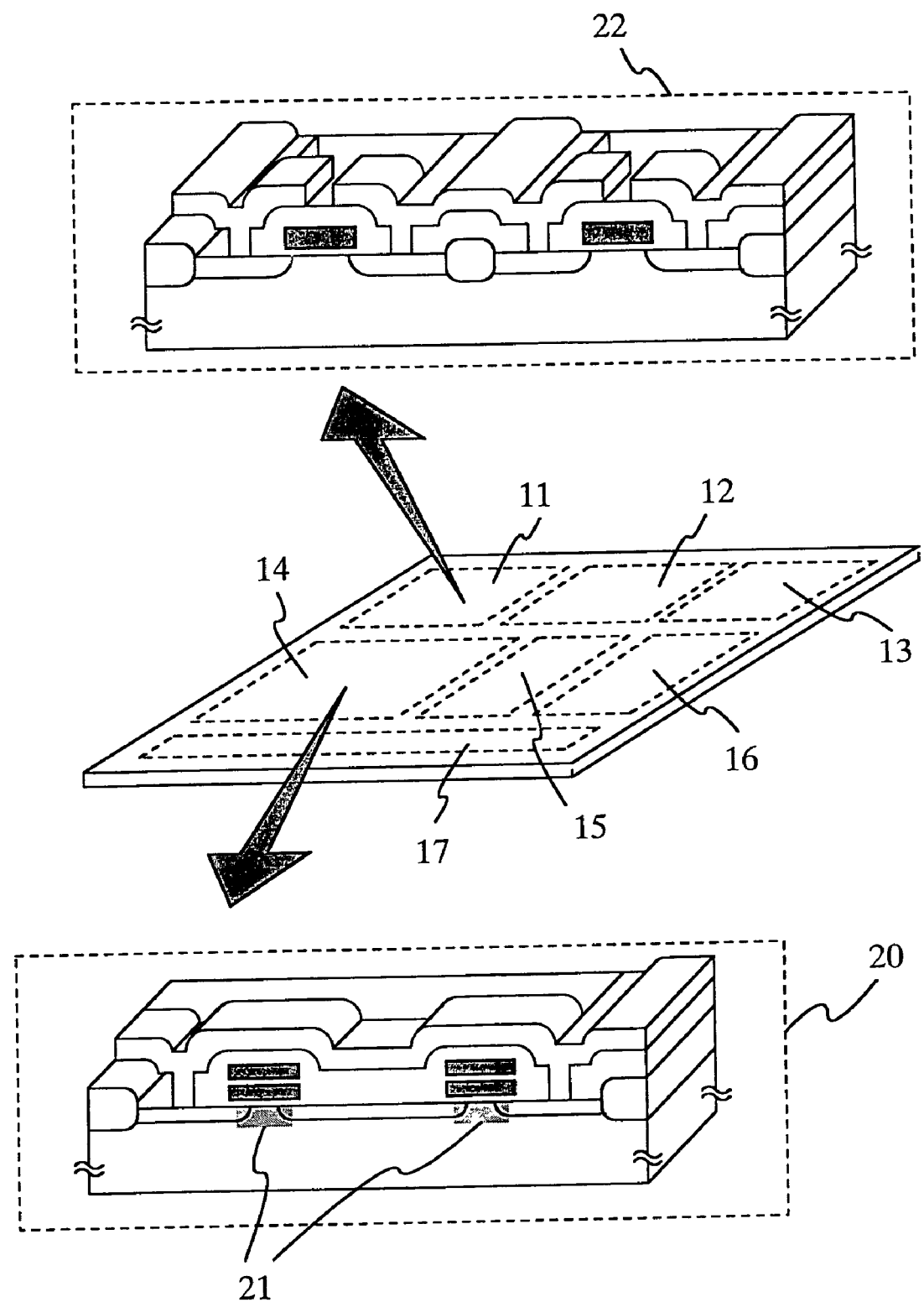

As occasion demands, a configuration shown in FIG. 12 may be employed. FIG. 12 shows a case where the logic sections (excluding the memory sections) are formed by ordinary CMOS circuits 22. This configuration is implemented by not forming pinning regions only in the logic sections.

In this manner, it is possible to determine, at the circuit designing stage, sections where pinning regions should be formed; a party who practices the invention may determine at will whether to form pinning regions in the entire circuit or only part of it. Where the invention is applied to a hybrid IC in which various functions are combined, such a high degree of freedom in circuit design is very effective.

Embodiment 10

This embodiment is directed to a case where a nonvolatile memory according to the invention that uses a single crystal silicon substrate having a buried oxide film is applied to a microprocessor such as a RISC processor or an ASIC processor that is integrated on one chip.

Figure 13:
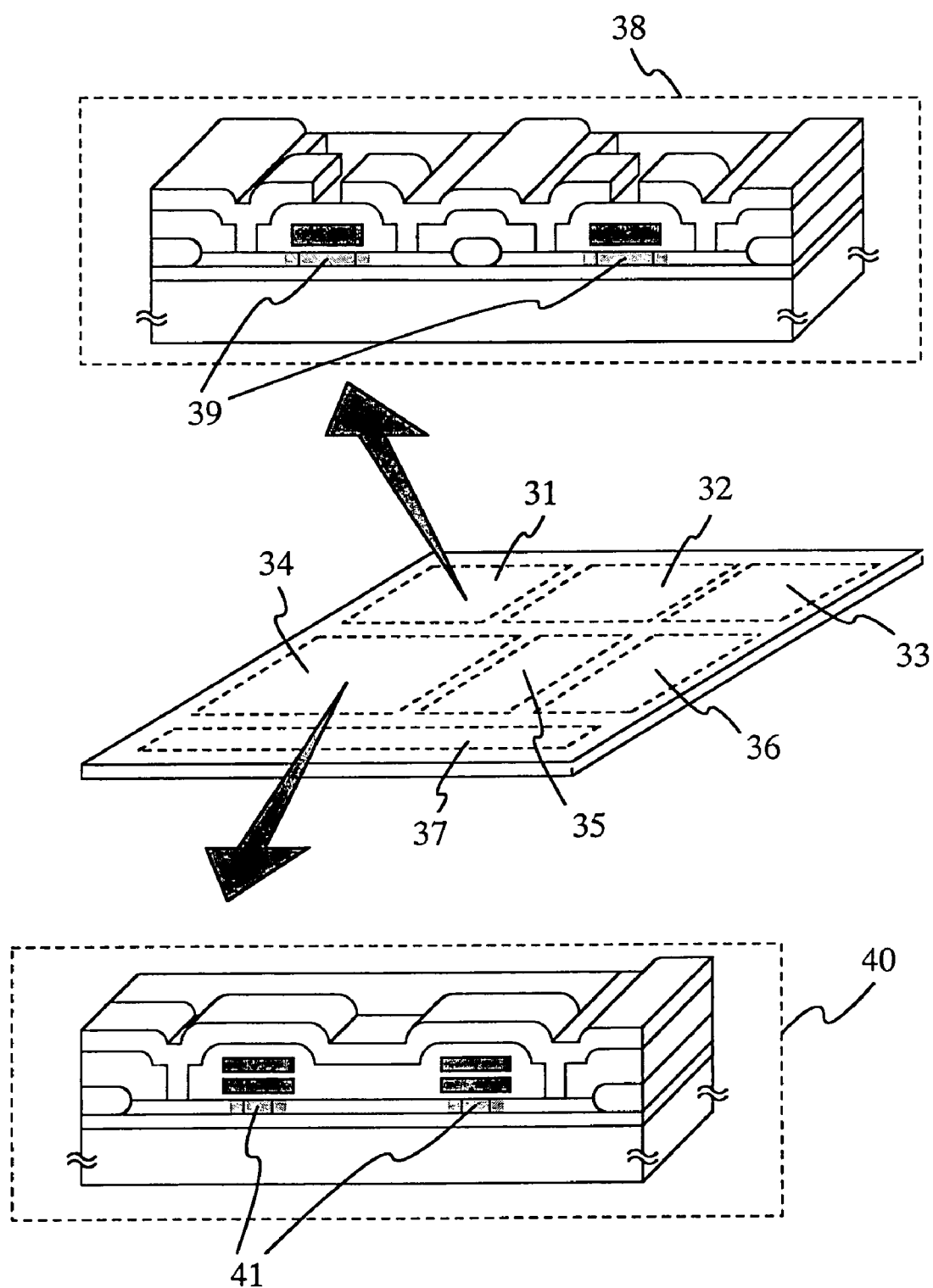
FIGS. 13 and 14 show microprocessors according to a 10th embodiment of the invention to which a nonvolatile memory of the invention is applied.

FIG. 13 shows an example of a microprocessor, which is typically composed of a CPU core 31, a flash memory 34 (or a RAM), a clock controller 33, a cache memory 32, a cache controller 35, a serial interface 36, an I/O port 37, and other components.

The microprocessor of FIG. 13 is a simplified example. Naturally, a variety of circuit designs are employed in actual microprocessors in accordance with their uses.

In the microprocessor of FIG. 13, the CPU core 31, the clock controller 33, the cache controller 35, the serial interface 36, and the I/O port 37 are constituted of CMOS circuits 38. Pinning regions 39 according to the invention are formed in the CMOS circuits 38.

In this manner, the basic concept of the invention can be applied to SOIFETs as well as nonvolatile memories, as disclosed in detail in Japanese Patent Laid-Open No. Hei. 10-93100. Japanese Patent Laid-Open No. Hei. 10-93100 has a corresponding U.S. patent application Ser. No. 08/931,697, which is herein incorporated by reference.

The flash memory 34 uses nonvolatile memory cells according to the invention that form a memory circuit 40. Every memory cell that constitutes the memory circuit 40 is formed with pinning regions 41. It is possible to use nonvolatile memory cells according to the invention also in the cache memory 32.

As described above, in the example of FIG. 13, the pinning technology of the invention is utilized in all of the memory sections and the logic sections.

Figure 14:
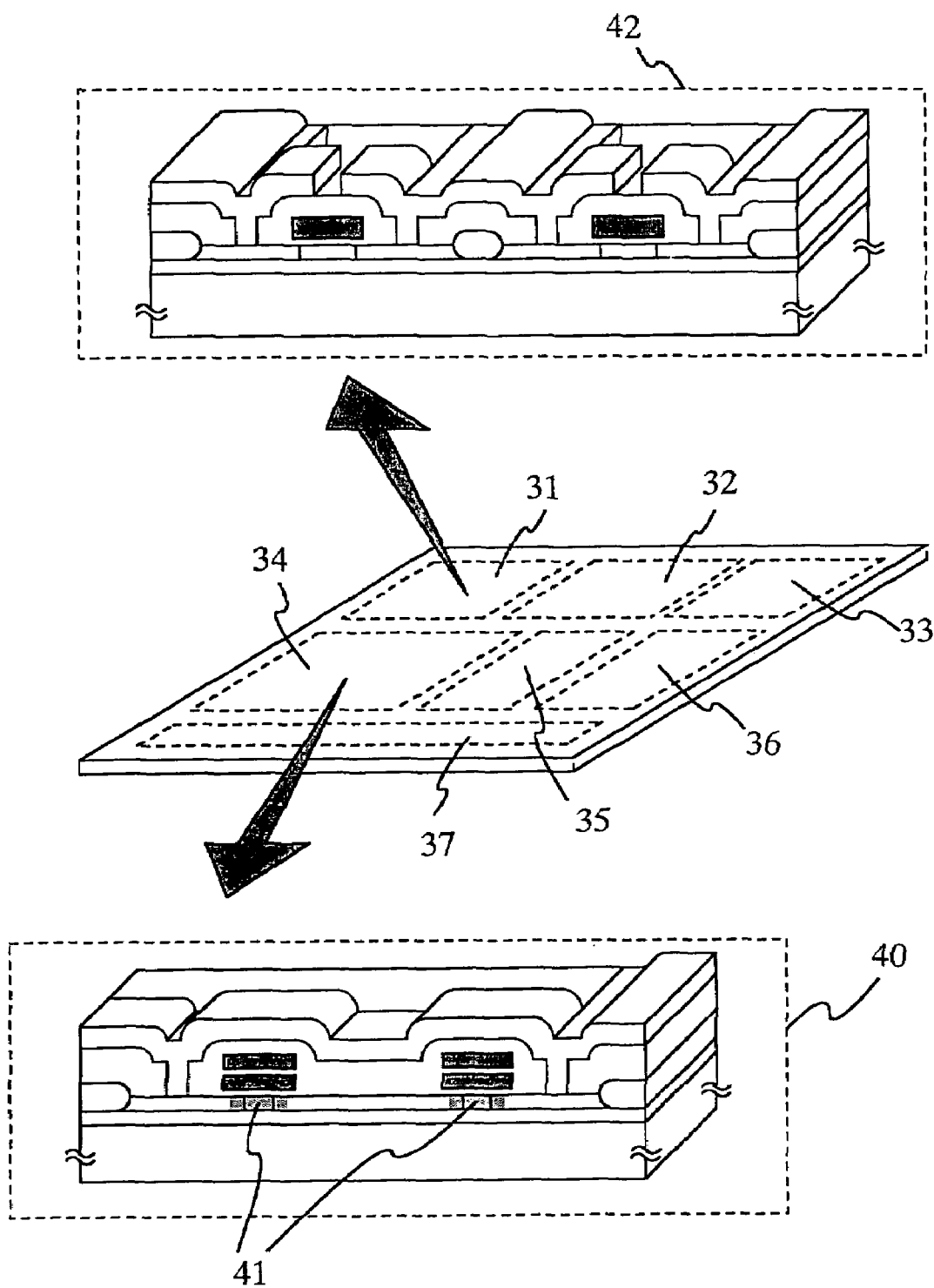

As occasion demands, a configuration shown in FIG. 14 may be employed. FIG. 14 shows a case where the logic sections (excluding the memory sections) are formed by ordinary CMOS circuits 42. This configuration is implemented by not forming pinning regions only in the logic sections.

In this manner, it is possible to determine, at the circuit designing stage, sections where pinning regions should be formed; a party who practices the invention may determine at will whether to form pinning regions in the entire circuit or only part of it. Where the invention is applied to a hybrid IC in which various functions are combined, such a high degree of freedom in circuit design is very effective.

Embodiment 11

The second embodiment was directed to the case (typically a SIMOX substrate) where a buried oxide film is provided in a single crystal silicon substrate and a single crystal silicon thin film is formed on the buried oxide film. On the other hand, a single crystal silicon thin film can be formed on crystallized glass, quartz, or ceramics by utilizing a technique called a smart cut method.

Where crystallized glass is used, it is effective to cover the entire surfaces (front, back, and side surfaces) with insulating silicon films. This measure makes it possible to prevent pollution due to glass constituent substances even when a high-temperature heat treatment is performed.

Since it is possible to use a kind of crystallized glass having approximately the same thermal expansion coefficient as a silicon film, stress occurring in a silicon thin film can be minimized. This is very important in manufacturing a highly reliable device.

For example, in a case of manufacturing a LCD (liquid crystal display) that is constituted of TFTs and nonvolatile memory cells using a single crystal silicon thin film, no stress-induced warp occurs even if an inexpensive glass substrate is used as an opposed substrate as long as crystallized glass is used as a device-side substrate. (A warp may occur due to a difference in thermal expansion coefficient if quartz used as a device-side substrate, in which case it is necessary to use an expensive quartz substrate as an opposed substrate.)

As described above, constructing a nonvolatile memory in which crystallized glass is used as a substrate and a single crystal silicon thin film is formed on an insulating film that covers the substrate is very effective in manufacturing a low-price product. The invention can easily be applied to such a case.

Embodiment 12

Although the second, third, fifth to eighth, 10 th, and 11 th embodiments were directed to the SOI structure in which a single crystal silicon thin film is used as a semiconductor layer, the single crystal silicon thin film used in each of those embodiments may be replaced by a polysilicon film.

A nonvolatile memory according to this embodiment will be described with reference to FIGS. 15A-15D. FIG. 15A is a top view of a nonvolatile memory of this embodiment, and FIGS. 15B and 15C are sectional views taken along lines A-A' and B-B' in FIG. 15A, respectively.

Figure 15B:
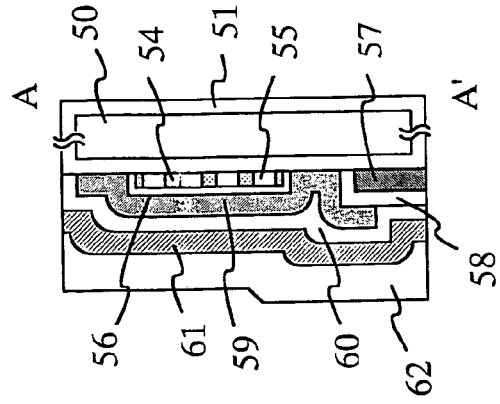
FIGS. 15A-15D show the structure of a nonvolatile memory according to a 12th embodiment of the invention.
Figure 15D:
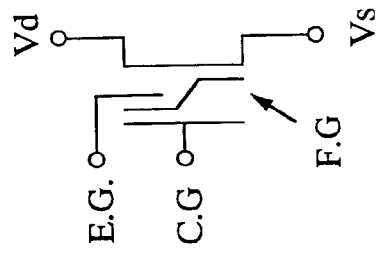
Figure 15A:
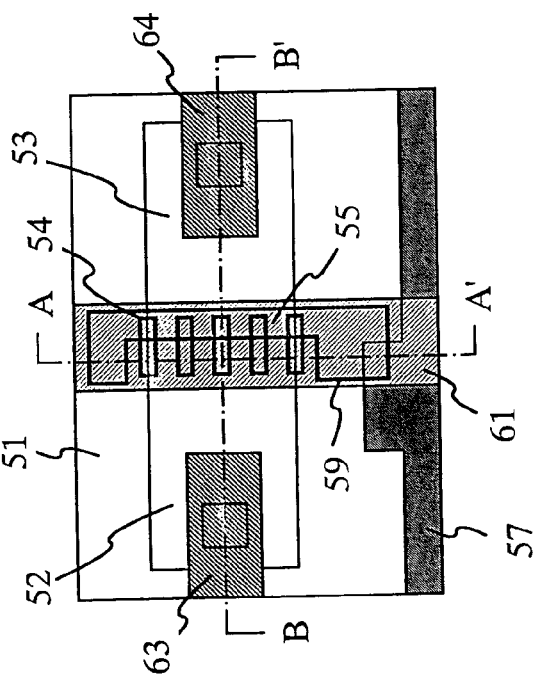
Figure 15C:
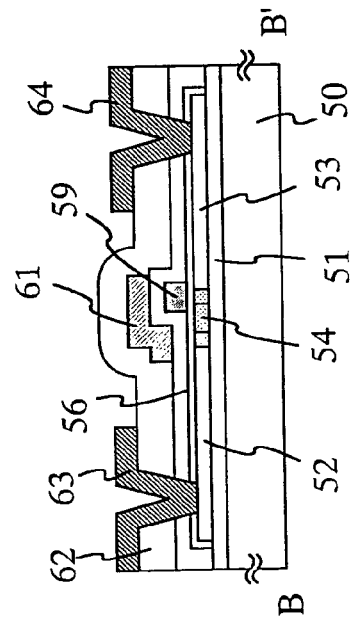

In FIGS. 15A-15C, reference numeral 50 denotes a crystallized glass (glass ceramics) substrate. A substrate made of a material having high heat resistance is used because a heat treatment at 700° C. or more is needed to form a polysilicon film used in this embodiment.

Although quartz may be used as a material having high heat resistance, an inexpensive crystallized glass substrate is used in this embodiment rather than an expensive quartz substrate. To prevent an escape of glass components, the crystallized glass substrate 50 is covered with a protective film 51 that is an insulating silicon film (a silicon oxide film, a silicon nitride film, a silicon oxynitride film, or the like).

An active layer that is a polysilicon thin film having a unique crystal structure is formed on the protective film 51, and a source region 52, a drain region 53, pinning regions 54, and channel forming regions 55 are formed in the active layer by adding an impurity to it. A method for forming the polysilicon thin film will be described later.

Then, a gate insulating film 56 is formed on the surface of the active layer (polysilicon thin film). Subsequently, an erasing gate 57 and a tunnel oxide film 58 are formed and then a floating gate 59 is formed.

After a first interlayer film 60 is formed so as to cover the floating gate 59, a control gate 61, a second interlayer film 62, a ground line 63, and a bit line 64 are sequentially formed to complete a stacked nonvolatile memory (EEPROM).

In this embodiment, as described above, a polysilicon thin film having a unique crystal structure that has been developed by the present assignee is used as the active layer (including the source region, the channel forming region, and the drain region).

Although naturally a polysilicon thin film formed by a known method may be used, to increase the operation speed of the memory itself and decrease the write voltage, it is desirable to use a polysilicon thin film having the above-mentioned unique crystal structure.

A technique for forming a polysilicon thin film having the unique crystal structure will be described below with reference to FIGS. 16A-16C.

Figure 16A:
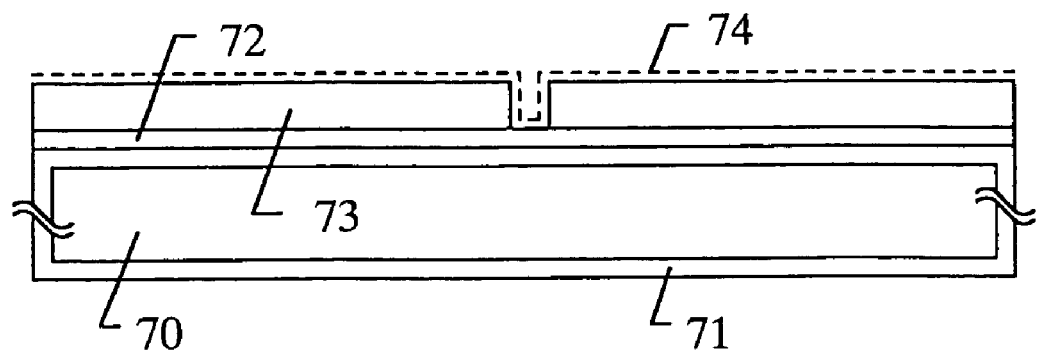
FIGS. 16A-16C show a manufacturing process of a polysilicon thin film according to the 12th embodiment of the invention.
Figure 16B:
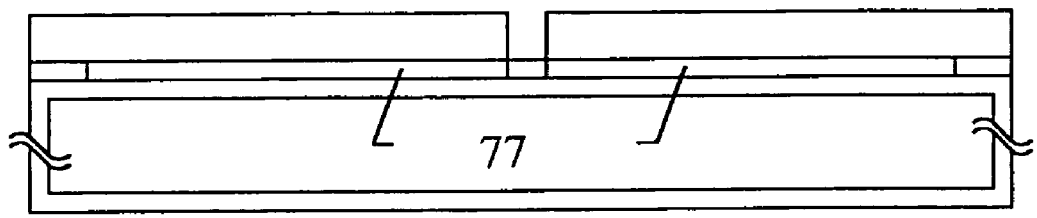
Figure 16C:
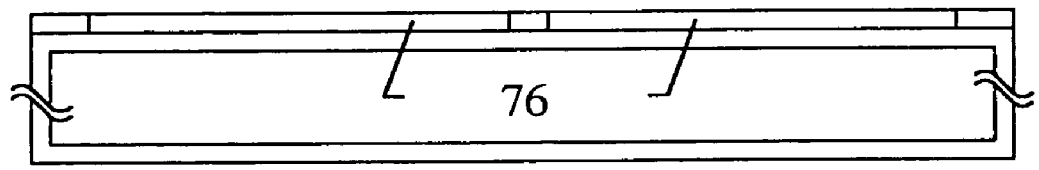

In FIG. 16A, reference numerals 70 denotes a crystallized glass substrate and numeral 71 denotes a protective film for preventing an escape of constituent substances from the crystallized glass substrate 70. An amorphous silicon film 72 is formed on the protective film 71 by low-pressure CVD, plasma CVD, or sputtering.

Where the amorphous silicon film 72 is formed by low-pressure CVD, it is preferable to remove films formed on the back and side surfaces before a later crystallization step. According to experiences of the inventors, the crystal state appears to be deteriorated if the crystallization step is executed with amorphous silicon films left on the back and side surfaces (the reason is unknown).

It is possible to use other semiconductor thin films such as a thin film of a silicon-germanium compound $Si_xGe_{1-x}$ (0<X<1). The thickness of the amorphous silicon film 73 may be set to 25-100 nm (preferably 30-60 nm).

Then, the step of crystallizing the amorphous silicon film 72 is executed by using a technique that is disclosed in Japanese Patent Laid-Open No. Hei. 7-130652 of the present inventors. Although either of the techniques described in the first and second embodiments of this publication, in this invention it is preferable to use the technique of the second embodiment of this publication (described in more detail in Japanese Patent Laid-Open No. Hei. 8-78329).

In the technique disclosed in the publication No. Hei. 8-78329, a mask insulating film 73 for selecting a catalyst element adding region is formed first. A catalyst element containing layer 74 is formed by applying a solution containing a catalyst element for accelerating crystallization of the amorphous silicon film 72 by spin coating (see FIG. 16A).

The catalyst element may be one or a plurality of elements selected from nickel (Ni), cobalt (Co), iron (Fe), palladium (Pd), platinum (Pt), copper (Cu), gold (Au), germanium (Ge), and lead (Pb). It is desirable to use nickel that has a good lattice matching relationship with silicon.

The above step of adding the catalyst element may be executed by ion implantation or plasma doping each of which uses a mask, rather than spin coating. Since the use of ion plantation or plasma doping facilitates reduction of the area occupied by the catalyst element adding region and control of the growth length of a lateral growth region, it is a technique effective in constructing a miniaturized circuit.

After the completion of the catalyst element adding step, hydrogen removal is performed at 500° C. for 2 hours. Then, the amorphous silicon film 72 is crystallized by performing a heat treatment at 500°-700° C. (typically 550°-650° C., preferably 570° C.) for 4-24 hours in an inert atmosphere, a hydrogen atmosphere, or an oxygen atmosphere see FIG. 16B).

In this step, the crystallization of the amorphous silicon film 72 proceeds with priority from nuclei that are generated in the region where the catalyst element is added, whereby crystal regions 75 are formed in which the crystallization has proceeded approximately parallel with the surface of the crystallized glass substrate 70. The inventors call the crystal regions 75 lateral growth regions. The lateral growth region has an advantage that it has superior crystallinity as a whole because individual crystals are combined together so as to be arranged relatively uniformly.

After the completion of the heat treatment for crystallization, the mask insulating film 73 is removed. Then, a heat treatment for removing the catalyst element (catalyst element gettering step) is performed. In this heat treatment, a halogen element is mixed into a processing atmosphere to utilize the metal element gettering effect of the halogen element.

To fully effectuate the gettering effect of the halogen element, it is preferable to perform the heat treatment at a temperature higher than 700° C. At a temperature lower than 700° C., there is a possibility that a halogen compound in the processing atmosphere is hard to decompose and resultantly the gettering effect is not obtained. It is preferable to set the heat treatment temperature and time at 800°-1,000° C. (typically 950° C.) and 0.1-6 hours (typically 0.5-1 hour), respectively.

Typically, the heat treatment may be performed at 950° C. for 30 minutes in an oxygen atmosphere containing a hydrogen chloride (HCl) gas at 0.5-10 vol % (preferably 3 vol %). A HCl density higher than the above range is not preferable because asperities whose heights are on the order of the film thickness will occur on the silicon surface.

Other than HCl, the compound containing a halogen element may be one or a plurality of compounds selected from HF, $NF_3$, HBr, $Cl_2$, $ClF_3$, $BCl_3$, $F_2$, and $Br_2$.

In this step, the catalyst element in the lateral growth regions 75 are gettered by the action of chlorine and removed into the air in the form of a volatile chloride. After the execution of this step, the concentration of the catalyst element in lateral growth regions 76 is reduced to $5 \times 10^{17}$ atoms/cm$^3$ or less (typically $2 \times 10^{17}$ atoms/cm$^3$ or less).

Although in this embodiment the catalyst element is gettered by the gettering ability of a halogen element, it is also possible to utilize the gettering ability of the element of phosphorus. In such a case, there may be employed a gettering step in which a layer containing phosphorus at a high concentration is provided adjacent to the lateral growth regions 75 and a heat treatment is performed to cause the phosphorus-containing layer to getter the catalyst element.

The resulting lateral growth regions 76 has a unique crystal structure that is a collected body of rod-like or flat-rod-like crystals. In the nonvolatile memory of this embodiment, a polysilicon thin film constituted of only a lateral growth region 76 is used as the active layer.

Specifically, the unique crystal structure is a structure in which rod-like crystals are arranged approximately parallel with each other and have particular directivity macroscopically. Further, individual crystals are connected to each other with extremely high continuity at their grain boundaries.

Detailed observation results of such a crystal structure are described in Japanese Patent Application Serial Nos. Hei. 9-55633, Hei. 9-165216, and Hei. 9-212428.

A polysilicon thin film formed by the above steps has grain boundaries where individual crystals are connected to each other with extremely high continuity (with a high level of matching), and the grain boundaries cause almost no obstruction to carrier movements. That is, this polysilicon thin film can be regarded as a silicon thin film having substantially no grain boundaries and hence can substantially be regarded as a single crystal (as a matter of fact, this polysilicon thin film exhibits an electron beam diffraction pattern that is very close to that of a single crystal).

The above polysilicon thin film is intrinsic or substantially intrinsic unless no impurity is added intentionally. The term "intrinsic" as used here means a state that impurities (i.e., atoms other than silicon atoms) are eliminated as much as possible and the polarity is almost negligible.

The invention can be applied to all kinds of nonvolatile memories using a semiconductor thin film that can substantially be regarded as a single crystal (i.e., a polycrystalline semiconductor thin film having the crystal structure described in this embodiment).

Embodiment 13

This embodiment is directed to a case where an impurity element for imparting the same conductivity type as the conductivity type of the pinning regions is added to the insulating layer (buried oxide film or the like) that underlies the semiconductor layer in the nonvolatile memory using the single crystal silicon substrate having the buried oxide film that was described in any of the second, third, fifth to eighth, and 10th to 12th embodiments.

In this embodiment, boron is used as an impurity that is added to the pinning regions. FIGS. 17A and 17B are sectional views that are focused on a channel forming region of a nonvolatile memory according to this embodiment. That is, FIGS. 17A and 17B are sectional views taken along the channel width direction of a channel forming region.

In FIG. 17A, reference numeral 81 denotes a single crystal silicon substrate; 82, a buried oxide film; 83, a channel forming region; and 84 and 85, pinning regions. This embodiment is characterized in that a boron-added region 86 is provided in the buried oxide film 82 in the vicinity of its surface.

The structure of FIG. 17B is the same as that of FIG. 17A except that boron is added to the entire buried oxide film 82.

FIG. 17C schematically shows an energy-related structure of the channel forming region 83 shown in FIG. 17A. In FIG. 17C, the energy is low in a region 88 and hence the region 88 serves as a channel forming region. High-energy regions 89 are formed in the vicinity of the pinning regions 84 and 85 and the buried oxide film 82 to which boron has been added intentionally due to leakage of the impurity element.

FIGS. 17D and 17E show energy profiles of the channel forming region 83. That is, FIG. 17D is an energy profile taken along a two-dot chain line X in FIG. 17C and the horizontal and vertical axes represent the distance in the channel width direction and the relative energy, respectively. FIG. 17E is an energy profile taken along a two-dot chain line Y in FIG. 17C and the horizontal and vertical axes represent the relative energy and the distance in the depth direction, respectively.

The energy profiles of FIGS. 17D and 17E are so drawn as to correspond, in position, to the energy-related structure of FIG. 17C.

As shown in FIG. 17D, the relative energy has a large value b in the pinning regions 84 and 85 and their vicinities. On the other hand, in a central portion (i.e., a portion farthest from the pinning regions 84 and 85) of a carrier movement region 88, the relative energy has the minimum value a.

On the other hand, as shown in FIG. 17E, the energy profile taken along the two-dot chain line Y is such that the relative energy is relatively high in the vicinity of the gate insulating film (not shown) and has the minimum value a in a central portion of the carrier movement region 88. The relative energy gradually increases as the position approaches the interface with the buried oxide film 82 and reaches a value b'.

If the concentration of the impurity added to the pinning regions 84 and 85 and that of the impurity added to the buried oxide film 82 are the same, b is equal to b'. If they are different from each other, b is not equal to b'. The invention may be of either case.

In the invention, it is preferable that the relative energy value b or b' be three times or more (ever preferably 10 times or more) larger than the relative energy value a. This provides a structure in which carriers (electrons or holes) move through the low-energy region 88 with priority.

Since a high energy barrier is formed at the interfaces between the channel forming region 83 and the buried oxide film 82 and its vicinity and keeps carriers away from itself, carrier scattering can be prevented from occurring in the vicinity of the surface of the underlying film (buried oxide film 82).

The above structure makes it possible to effectively suppress expansion of the depletion layer and to further increase the resistance to the short channel effect. In addition, by reducing the degree of carrier scattering in the vicinity of the surface of the underlying film, the hot electron injection can be made more efficient.

Embodiment 14

A semiconductor circuit (memory circuit) formed by nonvolatile memory cells according to the invention can be incorporated, as a recording medium for data storage and readout, in electronic apparatuses of every field. In this embodiment, examples of those electronic apparatuses will be described with reference to FIGS. 18A-18F.

Examples of electronic apparatuses which can use a nonvolatile memory of this embodiment are a video camera, an electronic still camera, a projector, a head-mounted display, a car navigation apparatus, a personal computer, portable information terminals (a mobile computer, a cellular telephone, a PHS, etc.).

Figure 18A:
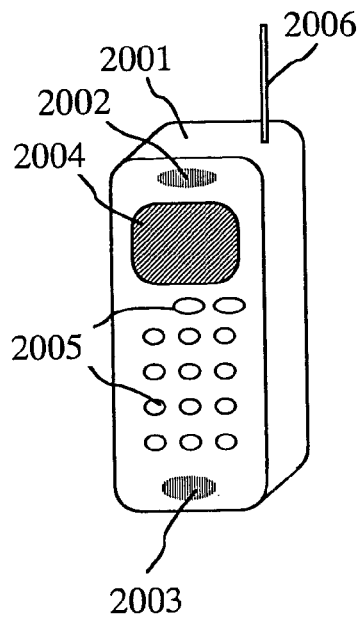
FIGS. 18A-18F show electronic apparatuses according to a 14th embodiment of the invention each of which uses a nonvolatile memory of the invention.

FIG. 18A shows a cellular telephone, which is composed of a main body 2001, a voice output section 2002, a voice input section 2003, a display device 2004, manipulation switches 2005, and an antenna 2006. A nonvolatile memory of this invention is incorporated in an LSI board and used to add an address function for recording telephone numbers.

Figure 18B:
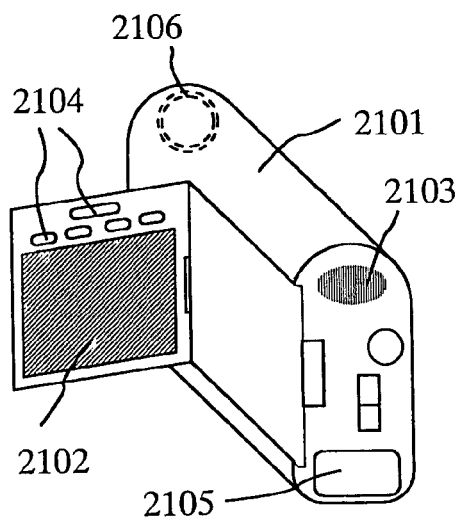

FIG. 18B shows a video camera, which is composed of a main body 2101, a display device 2102, a sound input section 2103, manipulation switches 2104, a battery 2105, and an image receiving section 2106. A nonvolatile memory of this embodiment is incorporated in an LSI board and used for such a function as storage of image data.

Figure 18C:
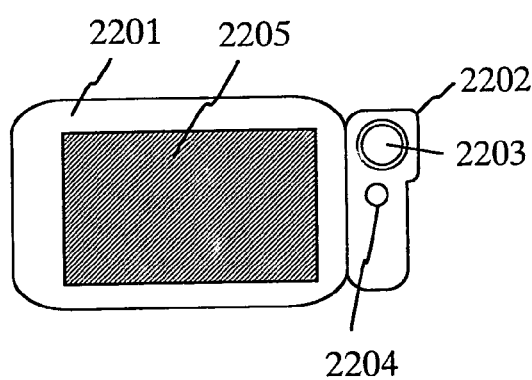

FIG. 18C shows a mobile computer, which is composed of a main body 2201, a camera section 2202, an image receiving section 2203, a manipulation switch 2204, and a display device 2205. A nonvolatile memory of this embodiment is incorporated in an LSI board and used for storage of processed data and image data.

Figure 18D:
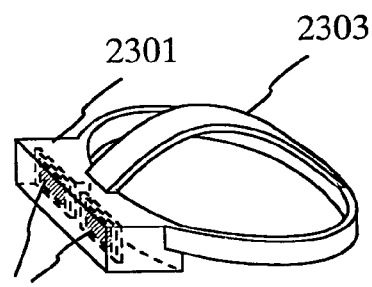

FIG. 18D shows a head-mounted display, which is composed of a main body 2301, display devices 2302, and a band section 2303. A nonvolatile memory of this embodiment is used in an image signal correction circuit that is connected to the display devices 2302.

Figure 18E:
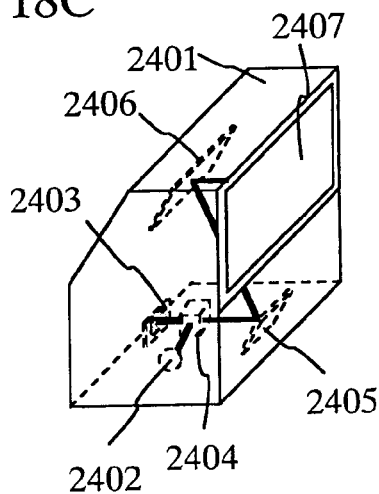

FIG. 18E shows a rear type projector, which is composed of a main body 2401, a light source 2302, a display device 2403, a polarizing beam splitter 2404, reflectors 2405 and 2406, and a screen 2407. A nonvolatile memory of this invention is used as a storage circuit for storing data to be supplied to a γ-correction circuit.

Figure 18F:
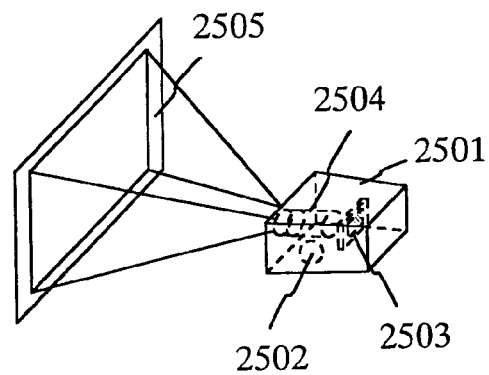

FIG. 18F shows a front type projector, which is composed of a main body 2501, a light source 2502, a display device 2503, an optical system 2504, and a screen 2505. A nonvolatile memory of this invention is used as a storage circuit for storing data to be supplied to a γ-correction circuit.

As described above, the application range of the invention is extremely wide and the invention can be applied to electronic apparatuses of every field. In addition to the above examples, a nonvolatile memory of the invention can be used as a storage medium that is indispensable in various control circuits and information processing circuits.

The invention makes it possible to minimize influences of the miniaturization effects as typified by the short channel effect and to further advance the miniaturization of nonvolatile memories.

The invention also makes it possible to realize small-area, large-capacity nonvolatile memories while securing their high reliability.

What is claimed is:

1. A semiconductor device comprising:
   a semiconductor substrate;
   a pair of first impurity regions being formed in the semiconductor substrate; an active region formed between the pair of first impurity regions in the semiconductor substrate;
   at least two second impurity regions formed in the semiconductor substrate between the pair of first impurity regions;
   at least one channel region between the at least two second impurity regions;
   boundaries between the channel region and the at least two second impurity regions extending in a direction along a carrier flow direction of the channel region;
   a floating gate formed over and insulated from the active region; and
   a control gate formed over and insulated from the floating gate,
   wherein the floating gate overlaps a boundary between at least one of the pair of the first impurity regions and the at least two second impurity regions, and
   wherein a length of the second impurity regions is longer than a channel length in a channel length direction.

2. A semiconductor device according to claim 1, wherein the at least two second impurity regions have a striped shape.

3. A semiconductor device according to claim 1, wherein an electronic device mounting the semiconductor device is any one of a mobile computer, a head-mounted display, a video camera, a cellular phone, a digital camera, a rear type projector, a front type projector.

4. A semiconductor device comprising:
   a NOR type circuit having a plurality of memory transistors, the memory transistor comprising:
   a semiconductor substrate;
   a pair of first impurity regions being formed in the semiconductor substrate;
   an active region formed between the pair of first impurity regions in the semiconductor substrate;
   at least two second impurity regions formed in the semiconductor substrate between the pair of first impurity regions;
   at least one channel region between the at least two second impurity regions;
   boundaries between the channel region and the at least two second impurity regions extending in a direction along a carrier flow direction of the channel region;
   a floating gate formed over and insulated from the active region; and
   a control gate formed over and insulated from the floating gate,
   wherein the floating gate overlaps a boundary between at least one of the pair of the first impurity regions and the at least two second impurity regions, and
   wherein a length of the second impurity regions is longer than a channel length in a channel length direction.

5. A semiconductor device according to claim 4, wherein the at least two second impurity regions have a striped shape.

6. A semiconductor device according to claim 4, wherein an electronic device mounting the semiconductor device is any one of a mobile computer, a head-mounted display, a video camera, a cellular phone, a digital camera, a rear type projector, a front type projector.

7. A semiconductor device comprising:
   a NAND type circuit having a plurality of one memory transistor, the memory transistor comprising:
   a semiconductor substrate;
   a pair of first impurity regions being formed in the semiconductor substrate;
   an active region formed between the pair of first impurity regions in the semiconductor substrate;
   at least two second impurity regions formed in the semiconductor substrate between the pair of first impurity regions;
   at least one channel region between the at least two second impurity regions;
   boundaries between the channel region and the at least two second impurity regions extending in a direction along a carrier flow direction of the channel region;

a floating gate formed over and insulated from the active region; and a control gate formed over and insulated from the floating gate, wherein the floating gate overlaps a boundary between at least one of the pair of the first impurity regions and the at least two second impurity regions, and wherein a length of the second impurity regions is longer than a channel length in a channel length direction.

8. A semiconductor device according to claim 7, wherein the at least two second impurity regions have a striped shape.

9. A semiconductor device according to claim 7, wherein an electronic device mounting the semiconductor device is any one of a mobile computer, a head-mounted display, a video camera, a cellular phone, a digital camera, a rear type projector, a front type projector.

10. A semiconductor device comprising:
a semiconductor film;
a pair of first impurity regions being formed in the semiconductor film;
an active region formed between the pair of first impurity regions in the semiconductor film;
at least two second impurity regions formed in the semiconductor film between the pair of first impurity regions;
at least one channel region between the at least two second impurity regions;
a floating gate formed over and insulated from the active region; and
a control gate formed over and insulated from the floating gate,
wherein the at least two second impurity regions have a dot-like shape or an elliptical shape, and
wherein the floating gate overlaps a boundary between at least one of the pair of the first impurity regions and the at least two second impurity regions.

11. A semiconductor device according to claim 10 further comprising a substrate, wherein the semiconductor film is formed over the substrate.

12. A semiconductor device according to claim 10, wherein an electronic device mounting the semiconductor device is any one of a mobile computer, a head-mounted display, a video camera, a cellular phone, a digital camera, a rear type projector, a front type projector.

13. A semiconductor device comprising:
a NOR type circuit having a plurality of memory transistors, the memory transistor comprising:
a semiconductor film;
a pair of first impurity regions being formed in the semiconductor film;
an active region formed between the pair of first impurity regions in the semiconductor film;
at least two second impurity regions formed in the semiconductor film between the pair of first impurity regions;
at least one channel region between the at least two second impurity regions;
a floating gate formed over and insulated from the active region; and
a control gate formed over and insulated from the floating gate,
wherein the at least two second impurity regions have a dot-like shape or an elliptical shape, and
wherein the floating gate overlaps a boundary between at least one of the pair of the first impurity regions and the at least two second impurity regions.

14. A semiconductor device according to claim 13 further comprising a substrate, wherein the semiconductor film is formed over the substrate.

15. A semiconductor device according to claim 13, wherein an electronic device mounting the semiconductor device is any one of a mobile computer, a head-mounted display, a video camera, a cellular phone, a digital camera, a rear type projector, a front type projector.

16. A semiconductor device comprising:
a NAND type circuit having a plurality of one memory transistor, the memory transistor comprising:
a semiconductor film;
a pair of first impurity regions being formed in the semiconductor film;
an active region formed between the pair of first impurity regions in the semiconductor film;
at least two second impurity regions formed in the semiconductor film between the pair of first impurity regions;
at least one channel region between the at least two second impurity regions;
a floating gate formed over and insulated from the active region; and
a control gate formed over and insulated from the floating gate,
wherein the at least two second impurity regions have a dot-like shape or an elliptical shape, and
wherein the floating gate overlaps a boundary between at least one of the pair of the first impurity regions and the at least two second impurity regions.

17. A semiconductor device according to claim 16 further comprising a substrate, wherein the semiconductor film is formed over the substrate.

18. A semiconductor device according to claim 16, wherein an electronic device mounting the semiconductor device is any one of a mobile computer, a head-mounted display, a video camera, a cellular phone, a digital camera, a rear type projector, a front type projector.

19. A semiconductor device according to claim 10 further comprising an insulating layer that underlies the semiconductor film, wherein the insulating layer comprises the same conductivity type impurity element as the at least two second impurity regions.

20. A semiconductor device according to claim 13 further comprising an insulating layer that underlies the semiconductor film, wherein the insulating layer comprises the same conductivity type impurity element as the at least two second impurity regions.

21. A semiconductor device according to claim 16 further comprising an insulating layer that underlies the semiconductor film, wherein the insulating layer comprises the same conductivity type impurity element as the at least two second impurity regions.

22. A semiconductor device comprising:
a semiconductor film including a source region, a channel forming region, and a drain region;
a pair of impurity regions formed at side edges along a channel length direction respectively;
a second impurity region formed between the pair of the impurity regions and along the channel length direction;
a floating gate formed over the channel forming region with a gate insulating film interposed therebetween; and
a control gate formed over the floating gate.

23. A semiconductor device comprising:
a NOR type circuit including a memory transistor, the memory transistor comprising:
a semiconductor film including a source region, a channel forming region, and a drain region;
a pair of impurity regions formed at side edges along a channel length direction respectively;
a second impurity region formed between the pair of the impurity regions and along the channel length direction;

a floating gate formed over the channel forming region with a gate insulating film interposed therebetween; and a control gate formed over the floating gate.

24. A semiconductor device comprising:

a NAND type circuit including a memory transistor, the memory transistor comprising:
  a semiconductor film including a source region, a channel forming region, and a drain region;
  a pair of impurity regions formed at side edges along a channel length direction respectively;
  a second impurity region formed between the pair of the impurity regions and along the channel length direction;
  a floating gate formed over the channel forming region with a gate insulating film interposed therebetween; and
  a control gate formed over the floating gate.

25. A semiconductor device comprising:

a semiconductor film including a source region, a channel forming region, and a drain region;
a pair of impurity regions formed at side edges of the channel forming region along a channel length direction respectively;
a second impurity region;
a field oxide film adjacent to the side edges;
a floating gate formed over the channel forming region; and
a control gate formed over the floating gate,
wherein the second impurity region is formed between the air of the impurity regions, and
wherein a length of the second impurity region is longer than a channel length in the channel length direction.

26. A semiconductor device comprising:

a NOR type circuit including a memory transistor, the memory transistor comprising:
  a semiconductor film including a source region, a channel forming region, and a drain region;
  a pair of impurity regions formed at side edges of the channel forming region along a channel length direction respectively;
  a second impurity region;
  a field oxide film adjacent to the side edges;
  a floating gate formed over the channel forming region; and
  a control gate formed over the floating gate;
  wherein the second impurity region is formed between the pair of the impurity regions, and
  wherein a length of the second impurity region is longer than a channel length in the channel length direction.

27. A semiconductor device comprising:

a NAND type circuit including a memory transistor, the memory transistor comprising:
  a semiconductor film including a source region, a channel forming region, and a drain region;
  a pair of impurity regions formed at side edges of the channel forming region along a channel length direction respectively;
  a second impurity region;
  a field oxide film adjacent to the side edges;
  a floating gate formed over the channel forming region; and
  a control gate formed over the floating gate;
  wherein the second impurity region is formed between the pair of the impurity regions, and
  wherein a length of the second impurity region is longer than a channel length in the channel length direction.

28. A semiconductor device according to claim 22, wherein the pair of the impurity regions is opposite conductivity type of the source region and drain region.

29. A semiconductor device according to claim 23, wherein the pair of the impurity regions is opposite conductivity type of the source region and drain region.

30. A semiconductor device according to claim 24, wherein the pair of the impurity regions is opposite conductivity type of the source region and drain region.

31. A semiconductor device according to claim 25, wherein the pair of the impurity regions is opposite conductivity type of the source region and drain region.

32. A semiconductor device according to claim 26, wherein the pair of the impurity regions is opposite conductivity type of the source region and drain region.

33. A semiconductor device according to claim 27, wherein the pair of the impurity regions is opposite conductivity type of the source region and drain region.

34. A semiconductor device according to claim 22, wherein the semiconductor film is a single crystal silicon film or a polysilicon film.

35. A semiconductor device according to claim 23, wherein the semiconductor film is a single crystal silicon film or a polysilicon film.

36. A semiconductor device according to claim 24, wherein the semiconductor film is a single crystal silicon film or a polysilicon film.

37. A semiconductor device according to claim 25, wherein the semiconductor film is a single crystal silicon film or a polysilicon film.

38. A semiconductor device according to claim 26, wherein the semiconductor film is a single crystal silicon film or a polysilicon film.

39. A semiconductor device according to claim 27, wherein the semiconductor film is a single crystal silicon film or a polysilicon film.

40. A semiconductor device comprising:

an oxide film;
a crystalline semiconductor film formed on the oxide film, including a source region, a channel forming region, and a drain region;
three impurity regions formed along a channel length direction respectively;
a floating gate formed over the channel forming region with a gate insulating film interposed therebetween; and
a control gate formed over the floating gate,
wherein the oxide film is doped with an impurity having the same conductivity type as that of the three impurity regions.

41. A semiconductor device according to claim 40, wherein the three impurity regions are opposite conductivity type of the source region and drain region.

42. A semiconductor device according to claim 40, wherein the semiconductor film is a single crystal silicon film or a polysilicon film.

43. A semiconductor device according to claim 1, wherein an impurity element concentration of the second impurity regions is in a range of $1 \times 10^{17}$ to $5 \times 10^{20}$ atoms/cm$^3$.

44. A semiconductor device according to claim 4, wherein an impurity element concentration of the second impurity regions is in a range of $1 \times 10^{17}$ to $5 \times 10^{20}$ atoms/cm$^3$.

45. A semiconductor device according to claim 7, wherein an impurity element concentration of the second impurity regions is in a range of $1 \times 10^{17}$ to $5 \times 10^{20}$ atoms/cm$^3$.

* * * * *